United States Patent [19]

Tanaka et al.

[11] Patent Number: 5,444,594
[45] Date of Patent: Aug. 22, 1995

[54] SNUBBER ENERGY RECOVERY CIRCUIT FOR PROTECTING SWITCHING DEVICES FROM VOLTAGE AND CURRENT

[75] Inventors: Shigeru Tanaka; William Ofosu-Amaah, both of Tokyo, Japan

[73] Assignee: Kabushiki Kaisha Toshiba, Kawasaki, Japan

[21] Appl. No.: 13,438

[22] Filed: Feb. 4, 1993

[30] Foreign Application Priority Data

Feb. 7, 1992 [JP] Japan .................... 4-021509
Feb. 20, 1992 [JP] Japan .................... 4-032476

[51] Int. Cl.⁶ .................................. H02H 7/122
[52] U.S. Cl. ........................... 361/58; 363/50; 363/55
[58] Field of Search ............... 361/13, 18, 54, 57, 361/58, 56; 363/53, 56, 58, 71, 57

[56] References Cited

U.S. PATENT DOCUMENTS

| | | | |
|---|---|---|---|
| 4,310,866 | 1/1982 | Wirth | 361/58 |
| 4,535,378 | 8/1985 | Endo | 361/18 |
| 4,546,423 | 10/1985 | Seki | 363/56 |
| 4,566,051 | 1/1986 | Komulainen | 361/13 |
| 5,031,088 | 7/1991 | Tanaka | 363/71 |

FOREIGN PATENT DOCUMENTS 62-15023  4/1987  Japan .

*Primary Examiner*—A. D. Pellinen
*Assistant Examiner*—Sally Medley
*Attorney, Agent, or Firm*—Oblon, Spivak, McClelland, Maier & Neustadt

[57] ABSTRACT

A snubber energy recovery circuit for protecting switching devices from current and voltage, which comprises a snubber circuit connected in parallel with a switching device, a recovery path for recovery the energy stored in the snubber circuit, and a constant-current source for maintaining current flowing in the recovery path at a constant value. The snubber circuit is composed of a snubber diode and a snubber capacitor, with one end of the recovery path being connected to the junction point of the snubber capacitor and snubber diode.

3 Claims, 21 Drawing Sheets

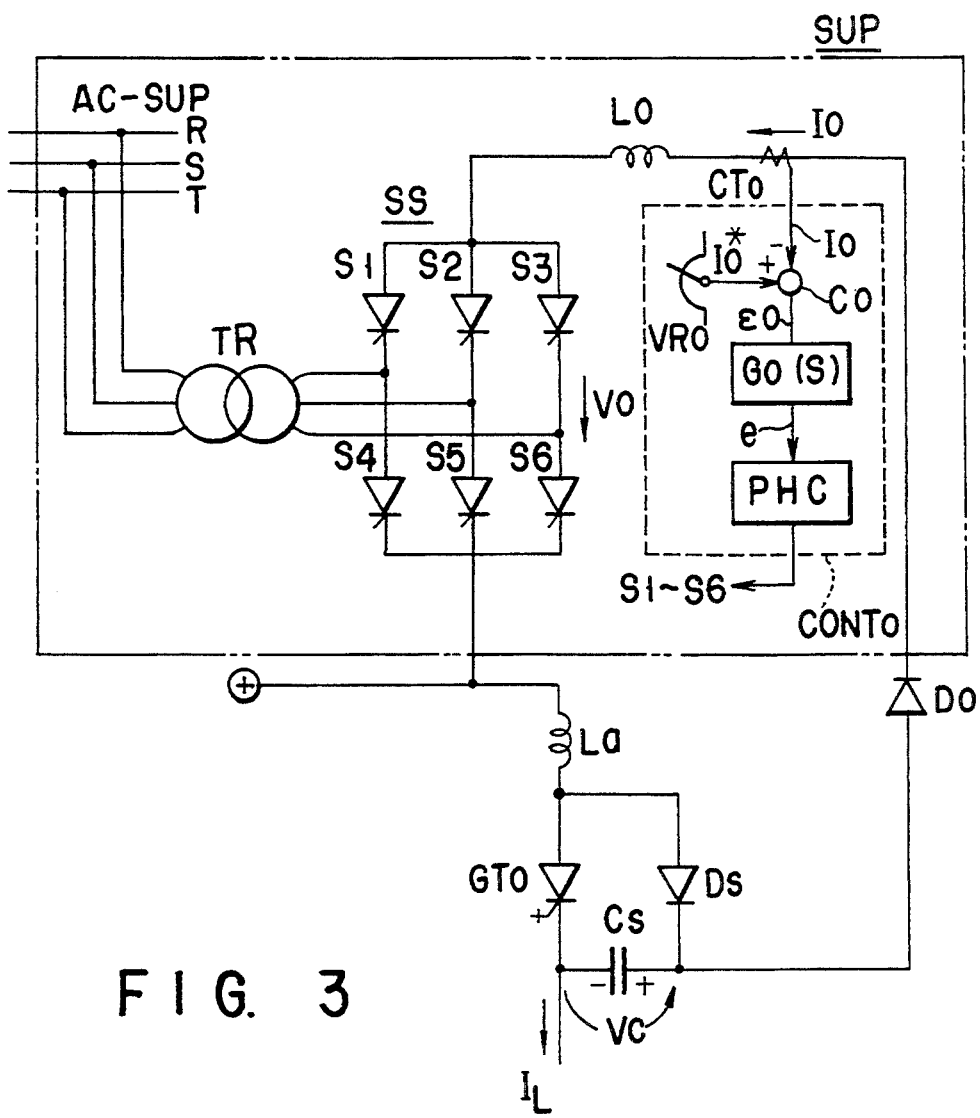
F I G. 3
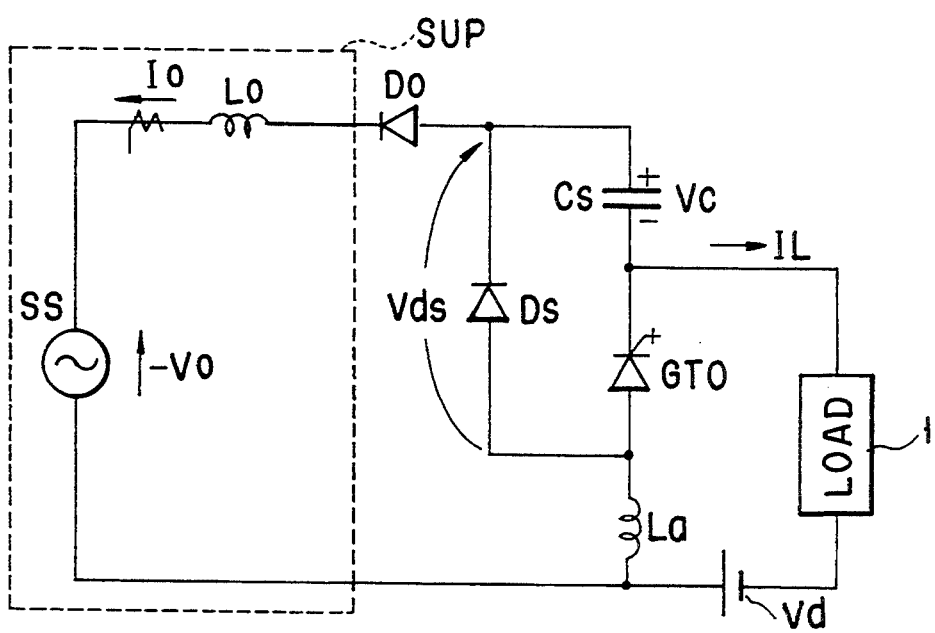
F I G. 4

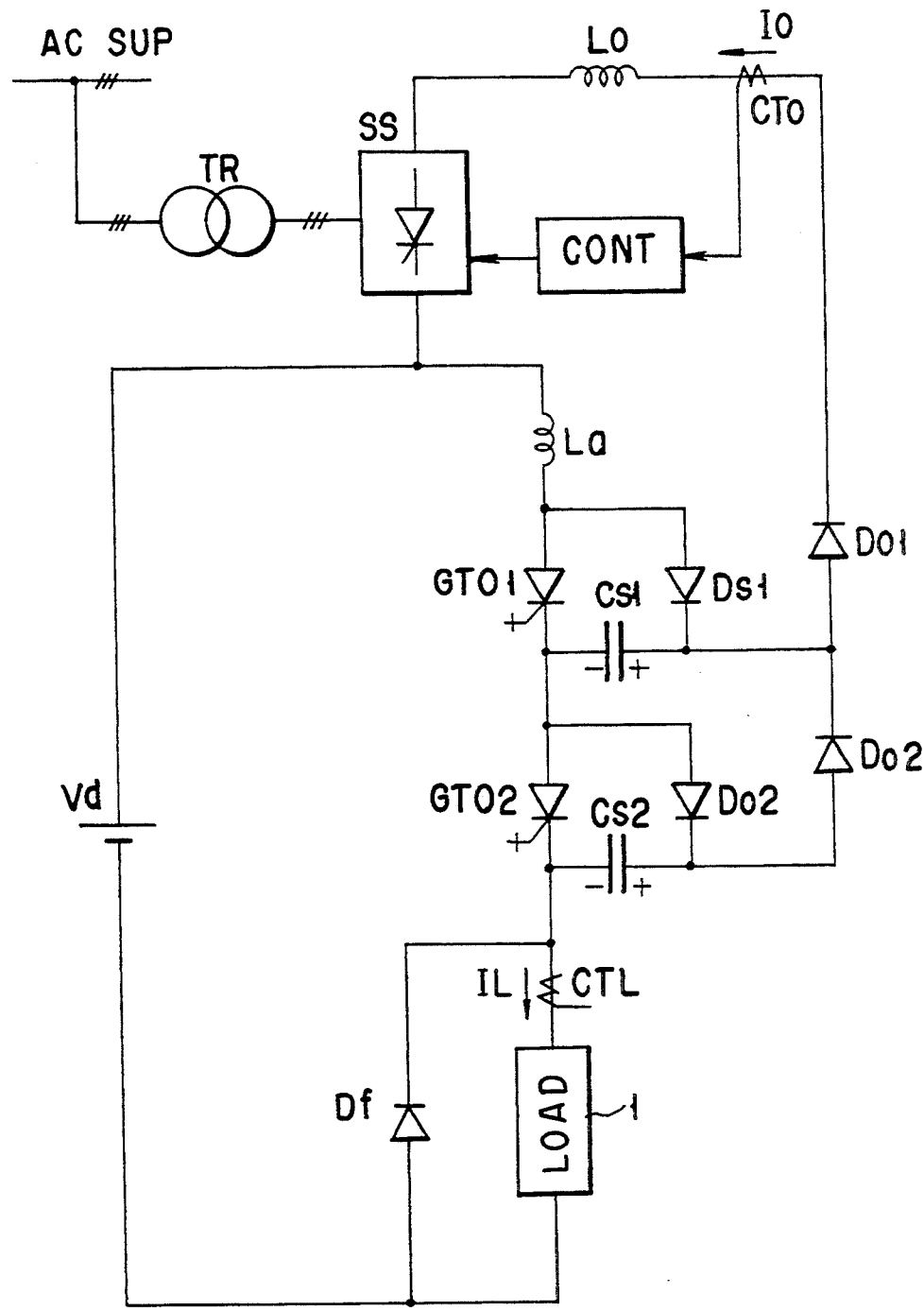
F I G. 9

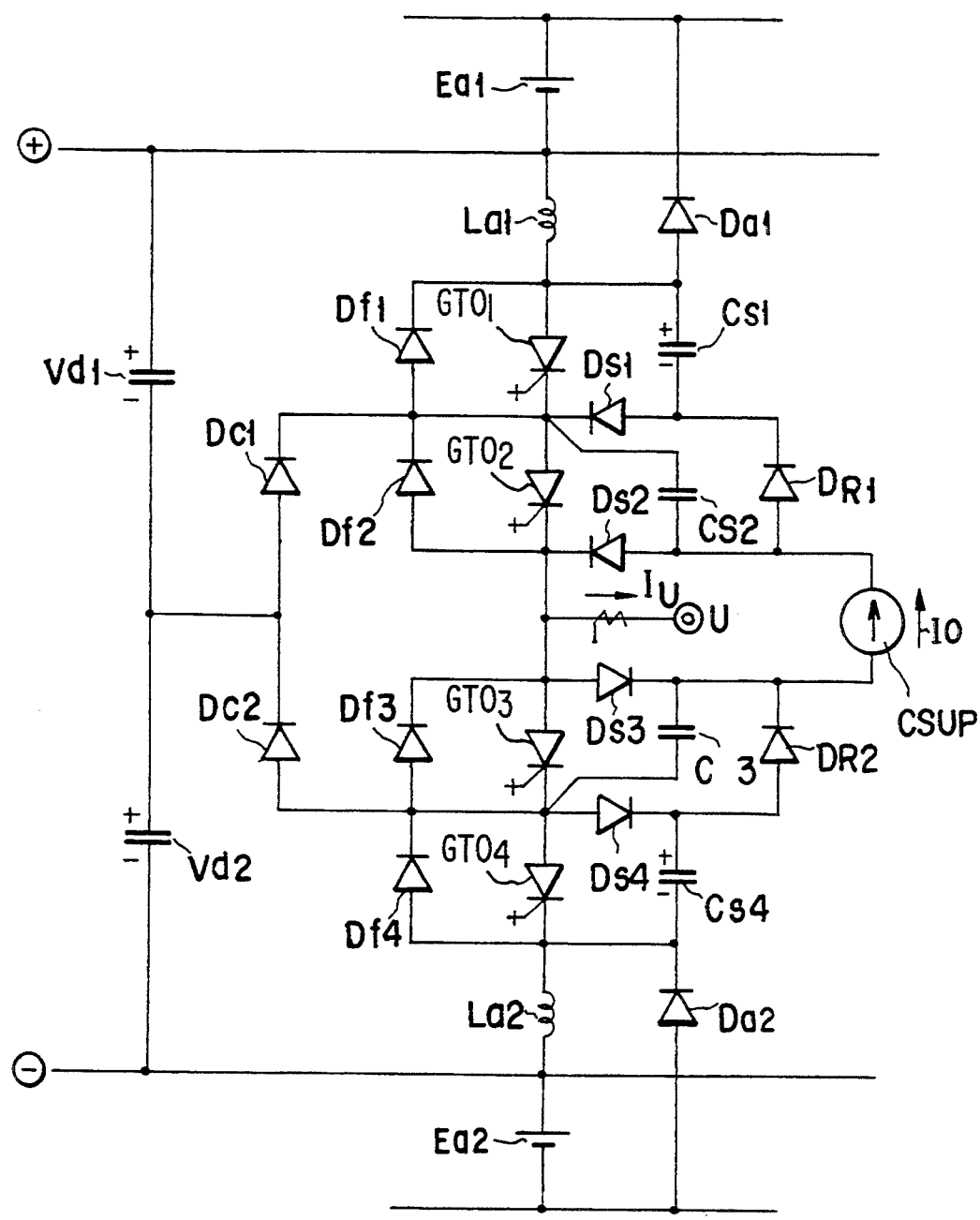
F I G. 20

SNUBBER ENERGY RECOVERY CIRCUIT FOR PROTECTING SWITCHING DEVICES FROM VOLTAGE AND CURRENT

BACKGROUND OF THE INVENTION

1. Field of the Invention

This invention relates to an apparatus for protecting self turn-off switching devices contained in inverters, chopper circuits or the like, and more particularly to a snubber energy recovery circuit for recovering energy from a snubber circuit that has stored energy caused by the switching of self turn-off switching devices.

2. Description of the Related Art

FIG. 23 shows the construction of a chopper circuit with a conventional snubber circuit and recovery circuit. In the chopper circuit, the positive terminal of a direct-current (DC) power supply Vd is connected to one end of a load 1 via a reactor La and a switching device with a self gate turn-off function (hereinafter, referred to as a GTO), and its negative terminal is connected to the other end of the load 1, across which a freewheeling diode Df is connected.

Connected in parallel with the GTO is a snubber circuit composed of a series circuit that contains a snubber diode Ds and a snubber capacitor Cs. The junction point of the snubber diode Ds and snubber capacitor Cs is connected to the positive terminal of the DC power source Vd via a series circuit that contains a recovery diode Do, a reactor Lo, and an auxiliary power supply Eo. A conventional snubber energy recovery circuit is composed of the above-mentioned snubber circuit and recovery circuit.

In the chopper circuit of FIG. 23, when the GTO turns on, the load 1 will be applied with the voltage Vd, which will increase the load current IL. When the GTO turns off, this will cause VL=0, which will allow current IL flowing in the load 1 to flow through the freewheeling diode Df until it attenuates.

The snubber circuit has the function of absorbing surge voltages caused by the reactor La, inductance components of the wires, etc, when the GTO turns off. Specifically, if no snubber circuit is used, when the GTO is turned off, the load current IL will be allowed to circulate through the freewheeling diode Df as noted earlier, but the current flowing through the reactor La will have nowhere to go, with the result that an excessive voltage will be applied to the GTO, thus destroying the GTO.

If a snubber circuit is connected to the GTO, when the GTO is turned off, the energy in the reactor La is stored in the capacitor Cs via the diode Ds, thereby protecting the GTO from excessive voltages and currents.

When the GTO then turns on, the voltage of the capacitor Cs discharges by means of a closed circuit made up of the recovery diode Do, reactor Lo, auxiliary power supply Eo, reactor La, GTO, and capacitor Cs.

With the above-described snubber energy recovery circuit, however, the reactor Lo inserted in the recovery circuit lengthens the discharging time of the capacitor Cs, making it impossible to use this apparatus for a GTO with a high switching frequency.

If the reactor Lo is removed from the recovery circuit, a resonance current will be caused by the capacitor Cs and reactor La, which will create the problem that a large current flows through the GTO.

SUMMARY OF THE INVENTION

It is, accordingly, an object of the present invention to solve the aforementioned problems by providing a snubber energy recovery circuit which is suitable for protecting switching devices constituting high-capacity chopper circuits, inverters, or the like, which can suppress an increase in current when the switching device turns on, by shortening the discharging time of the snubber capacitor, and which allows a compact design.

A snubber energy recovery circuit of the present invention comprises: a snubber circuit containing a series circuit connected in parallel with a switching device, the series circuit being composed of a snubber diode and a snubber capacitor; a recovery path which has a first end connected to the junction point of the snubber capacitor and the snubber diode of the series circuit and a second end connected to a main circuit, and which recover the energy stored in the snubber capacitor to the main circuit; and a DC constant-current source, connected to the recover path, which maintains the current flowing in the recover path at a predetermined constant value.

More specifically, the recovery path has a recovery diode and a DC reactor, and the constant-current source contains an alternating-current (AC) power source, an AC-to-DC power converter connected to the AC power source and inserted between the DC reactor in the recovery path and the main circuit, and a control circuit for controlling the AC-to-DC power converter so that current flowing through the DC reactor may be constant.

With the present invention thus constructed, if it is assumed that there is a reactor La (hereinafter, referred to as an anode reactor La) in the main circuit, the DC constant-current source SUP flows a constant DC current in a path running through the DC constant-current source SUP, anode reactor La, snubber diode Ds, recovery diode Do, and DC constant-current source SUP in that order, independently of the charging and discharging of the snubber capacitor Cs.

Specifically, an AC-to-DC power converter SS and a DC reactor Lo are provided, and the AC-to-DC power converter SS is controlled so that the current flowing through the DC reactor Lo may be constant.

The value of the DC current Io is selected for a value nearly one digit smaller than the rated current IL in the main circuit. The inductance of the DC reactor Lo is selected for a large value of approximately 10 mH to suppress current ripples.

When the switching device is turned on, a current equal to the sum of the load current IL and the constant current Io flows through the switching device. Since the DC constant current Io is one digit smaller than the load current IL, an increase in current in the device becomes a less significant problem.

When the switching device turns off, the load current IL flowing through the anode reactor La is shut off, and then allowed to flow into the snubber capacitor Cs via the snubber diode Ds to charge the capacitor.

Next, when the switching device is turned on, the snubber diode Ds is applied with a reverse-bias voltage, permitting the current Io from the DC constant-current source SUP to flow in a path running through the DC constant-current source SUP, anode reactor La, switching device, snubber capacitor Cs, recovery diode Do, and DC constant-current source SUP in that order. This current path remains until the voltage Vc at the snubber capacitor Cs drops to zero. If the current Io is constant, the time ΔTo required for the voltage Vc at the snubber capacitor Cs to become zero is expressed as:

$$\Delta To = Vc \cdot Cs / Io$$

If Vc=2,000 V, Cs=6 μF, and Io=200 A, the time ΔTo will be ΔTo=60 μsec.

When the capacitor voltage Vc=0 is reached, the snubber diode Ds conducts current again, allowing the current Io from the DC constant-current source SUP to flow in a path running through the DC constant-current source SUP, anode reactor La, snubber diode Ds, recovery diode Do, and DC constant-current source in that order.

After this, the switching is always ready to be tuned off. The switching device only requires the minimum on time of ΔTo=60 μsec.

For example, when the DC constant-current source CSUP is composed of an AC power source AC-SUP, an AC-to-DC power converter SS, and a DC reactor Lo, the energy $(\frac{1}{2})Cs \cdot Vc^2$ in the snubber capacitor Cs is transferred to the DC reactor Lo once, further converted into AC power by a power converter (for example, a thyristor converter) SS, and then regenerated to the AC power supply.

Further, a snubber energy recovery circuit of the present invention, which is applied to a main circuit containing a switching device and a current-suppressing reactor connected in series, comprises: a snubber circuit containing a series circuit connected to the main circuit so as to be in parallel with the switching device, the series circuit being composed of a snubber diode and a snubber capacitor a first recover path which has a first end connected to the junction point of the snubber capacitor and the snubber diode of the series circuit and a second end connected to the main circuit, and which recovers the energy stored in the snubber capacitor to the main circuit via a first recovery diode; a second recovery path which is connected between one end and the other end of the reactor connected to the switching device and which recover the energy left in the reactor to the main circuit via a second recovery diode when the voltage of the snubber capacitor has reached a specified value; a DC constant-current source, connected to the first recovery path, which maintains the current flowing in the first recovery path at a predetermined constant value; and a DC constant-voltage source inserted in the second recovery path.

With the present invention thus constructed, when the switching device is off, the DC constant-current source CSUP flows a constant current in a path running through the DC constant-current source CSUP, anode reactor La, snubber diode Ds, first recovery diode D1, and DC constant-current source CSUP in that order.

When the switching device turns off, the energy stored in the inductance of the wires and the anode reactor La for current suppression is transferred to the snubber capacitor Cs via the snubber diode Ds.

When the charging voltage Vc at the snubber capacitor Cs becomes high, the energy in the anode reactor La is recovered to the DC constant-voltage source VSUP via the second recovery diode D2. That is, the voltage generated by the anode reactor La is suppressed to the voltage Edc of the DC constant-voltage source VSUP. In the case of a chopper circuit, the maximum value Vcm of the voltage charged in the snubber capacitor Cs equals the sum of the main DC voltage Vd, the voltage ΔE caused by the inductance Lc of the wires, and the voltage Edc of the DC constant-voltage source VSUP:

$$Vcm = Vd + \Delta E + Edc$$

$$\Delta E = Lc \cdot (di/dt)$$

The voltage Edc of the DC constant-voltage source VSUP is selected for a value nearly one digit smaller than the main DC source voltage Vd. With ΔE being sufficiently small, if, for example, Vd=3,000 V and Edc=300 V, the maximum value Vcm will be Vcm=3,300 V.

The DC constant-voltage source VSUP, which is a voltage source capable of power recovery, is composed of, for example, a DC smoothing capacitor, a DC/DC converter, and others. Therefore, the energy in the current suppression anode reactor La is first transferred to the snubber capacitor Cs, and then most of the energy is recovered to the DC constant-voltage source VSUP.

Next, when the switching device turns on, the current Io from the DC constant-current source CSUP flows in a path running through CSUP, La, switching device, Cs, D1, and CSUP in that order. Namely, the voltage Vs of the snubber capacitor Cs will be discharged at a constant current Io. The DC current Io is selected for a value one digit smaller than the rated current (load current) IL in the main circuit.

When the switching device is turned on, the switching device carries a current equal to the sum of the load current IL and the constant current Io. If the current Io is constant, the time ΔTo required for the voltage Vc of the snubber capacitor Cs to become zero is expressed as:

$$\Delta To = Vc \cdot Cs / Io$$

For instance, if Vc=3,000 V, Cs=6 μF, and Io=200 A, this will give ΔTo=90 μsec.

When the capacitor voltage Vc=0 is reached, the snubber diode Ds conducts current again, the current Io from the DC constant-current source CSUP flows in a path running through CSUP, La, Ds, D1, and CSUP in that order.

After this, the switching device is always ready to be turned off. The switching device only requires the minimum on time of ΔTo=90 μsec.

Still further, a snubber energy recovery circuit of the present invention is applied to a power converter that contains a DC power source, a first and second switching blocks connected in series between the positive terminal and negative terminal of the DC power source, and a reactor inserted at least either between the positive terminal of the DC power source and the positive end of the first switching block or between the negative terminal of the DC power source and the negative end of the second switching block, the first and second switching blocks each having the same number of switching devices connected in series in a forward direction, and freewheeling diodes connected inversely in parallel with each of the switching devices, the snubber energy recovery circuit comprising: a snubber circuit having series circuits connected in parallel with each of the switching devices, wherein each series circuit provided for each switching device in the first switching block contains a snubber diode whose cathode is connected to the cathode of the switching device, and a capacitor provided between the anode of the snubber diode and the anode of the switching device, and each series circuit provided for each switching device in the second switching block contains a snubber diode whose anode is connected to the anode of the switching device and a snubber capacitor provided between the cathode of the snubber diode and the cathode of the switching device; a recovery path for connecting the Junction point of the snubber diode of a series circuit provided for a switching device at the positive end of the first switching block and the switching device to the junction point of the snubber diode of a series circuit provided for a switching device at the positive end of the second switching block and the switching device; and a constant-current source, connected to the recovery path, for maintaining current flowing through the recovery path at a predetermined constant value.

When a single first switching device is provided in the first switching block, and a single second switching device is provided in the second switching block, this constitutes a two-level output converter. In the explanation below, the name of each component associated with the first switching device is preceded by "the first" and that of each component associated with the second switching device is preceded by "the second."

When the first switching device turns on, the charges accumulated in the first snubber capacitor during the off period of the first switching device discharges at a constant current in a path running through the DC constant-current source, the first snubber capacitor, the first switching device, the second snubber diode, and the DC constant-current source in that order, which allows the snubber energy stored in the first snubber capacitor to be recovered to the DC constant-current source.

On the other hand, when the second switching device turns on, the charges accumulated in the second snubber capacitor during the off period of the second switching device discharges at a constant current in a path running through the DC constant-current source, the first snubber diode, the second switching device, the second snubber capacitor, and the DC constant-current source in that order, which allows the snubber energy stored in the second snubber capacitor to be regenerated to the DC constant-power source.

When a first and second switching devices are provided in the first switching block, and a third and fourth switching devices are provided in the second switching block, this constitutes a three-level output converter. In the explanation below, the name of each component associated with the third switching device is preceded by "the third" and that of each component associated with the fourth switching device is preceded by "the fourth."

When the second and third switching devices are on (the first and fourth switching devices are off), the first and fourth snubber capacitors are applied with a voltage of approximately half of the DC power source voltage. In this state, when the third switching device is then turned off, and the first switching device is turned on, the first and second snubber diodes are reverse-biased with the voltage of the first snubber capacitor, which allows the discharging current to flow in a path running through the DC constant-current source, the first recovery diode, the first snubber capacitor, the first switching device, the second switching device, the third snubber diode, and the DC constant-current source in that order, with the result that the energy stored in the first snubber capacitor is recovered to the DC constant-current source.

When the first and second switching device are on while the third and fourth switching devices are off, the third and fourth snubber capacitors are applied with a voltage. In this state, when the first switching device turns off again, and the third switching device turns on, the third snubber diode is reverse-biased with the voltage of the third snubber capacitor, which allows the discharging current from the third snubber capacitor to flow in a path running through the DC constant-current source, the second snubber diode, the third switching device, the third snubber capacitor, and the DC constant-current source in that order, with the result that the energy stored in the third snubber capacitor is recovered to the DC constant-current source.

In the state where the second and third switching devices are on, when the second switching device turns off, and the fourth switching device turns on, the third and fourth snubber diodes are reverse-biased with the voltage of the fourth snubber capacitor, which allows the discharging current from the fourth snubber capacitor to flow in a path running through the DC constant-current source, the second snubber diode, the third switching device, the fourth switching device, the fourth snubber capacitor, the second recovery diode, and the DC constant-current source in that order, with the result that the energy stored in the fourth snubber capacitor is recovered to the DC constant-current source.

Further, in the state where the third and fourth switching devices are on, when the fourth switching device turns off again, and the second switching device turns on, the second snubber diode is reverse-biased with the voltage of the second snubber capacitor, which allows the discharging current from the second snubber capacitor to flow in a path running through the DC constant-current source, the second snubber capacitor, the second switching device, the third snubber diode, and the DC constant-current source in that order, with the result that the energy stored in the second snubber capacitor is recovered to the DC constant-current source.

As described above, with the present invention, the energy in the snubber capacitors for all devices can be recovered by providing a single constant-current source for not only ordinary two-level output inverters but also inverters with three-level outputs or more. Further, the value of the discharging current from the snubber capacitors is equal to that of the constant-current source, which eliminates excessive resonance current (discharging current) that had been a problem in conventional equivalents.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a schematic diagram of a DC constant-current source provided for the snubber energy recovery circuit of FIG. 1;

FIG. 4 is an equivalent circuit diagram of the snubber energy recovery circuit of FIG. 1;

FIG. 9 is a schematic diagram of an embodiment in which a snubber energy recovery circuit associated with the present invention is applied to an apparatus with a series circuit containing two switching device;

FIG. 20 is a schematic diagram of an embodiment in which a snubber energy recovery circuit associated with the present invention is applied to a three-level output inverter;

DETAILED DESCRIPTION OF THE PREFERRED EMBODIMENTS

Figure 1:
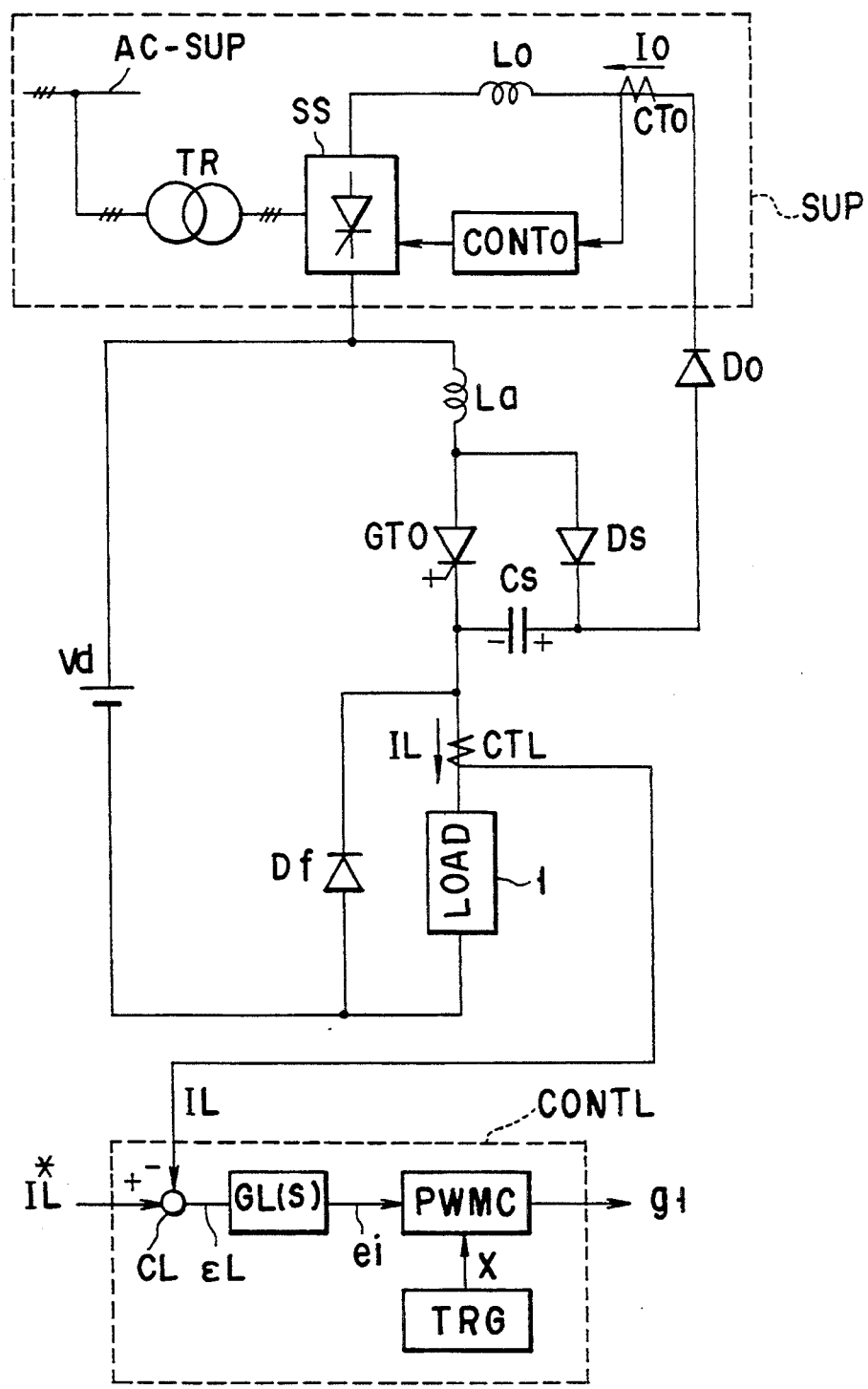
FIG. 1 is a schematic diagram of an embodiment in which a snubber energy recovery circuit associated with the present invention is applied to a main circuit with a single switching device.

Referring to FIGS. 1 to 5, an embodiment in which a snubber energy recovery circuit of the present invention is applied to a chopper circuit will be explained. FIG. 1 shows the overall construction of the embodiment. A load 1 is connected across both terminals of a direct-current (DC) power source Vd for the chopper circuit, with a freewheeling diode Df connected in inverse-parallel with the load 1. Between the positive terminal of the DC power source Vd and the load 1, an anode rector La and a GTO are inserted in series. The GTO is controlled by a load-current control circuit CONTL.

The GTO is connected in parallel with a series circuit that contains a snubber diode Ds and a snubber capacitor Cs. The anode of the snubber diode Ds is connected to the anode of the GTO. The snubber capacitor Cs is provided between the cathode of the snubber diode Ds and the cathode of the GTO.

The junction point of the snubber diode Ds and snubber capacitor Cs is connected to one end of a reactor Lo via a recovery diode Do in a forward direction. The other end of the reactor Lo is connected to a junction point between the DC power source Vd and the anode rector La via a externally excited converters.

The current Io flowing through the reactor Lo is held at a constant value by a DC constant-current source SUP containing the reactor Lo.

A concrete construction of the DC constant-current source SUP is shown in FIG. 3. In the figure, reference characters AC-SUP indicate a three-phase alternating-current (AC) power source, TR a three-phase transformer, SS a three-phase externally-excited converter composed of thyristors S1 through S6, CTo a current detector, CONTo a control circuit, VRo a current designation generator, Co a comparator, Go(s) a current-control compensation circuit, and PHC a phase control circuit. Connected between the reactor Lo and the anode reactor La is the three-phase externally-excited converter SS, to which the three-phase AC power supply AC-SUP is connected via the three-phase transformer TR.

The load-current control circuit CONTL is composed of a comparator CL, a current-control compensation circuit GL (s), a pulse-width modulation control circuit PWMC, and a triangular wave generator TRG.

The operation of the embodiment thus constructed will be explained hereinafter.

A brief explanation will first be given as to the operation of the chopper circuit. A load current IL is sensed by a current detector CTL. The comparator CL produces a deviation εL of IL from a designated current value IL*, which is then amplified by the current-control compensation circuit GL(s). The resulting signal is supplied to the pulse-width modulation control circuit PWMC.

Figure 2:
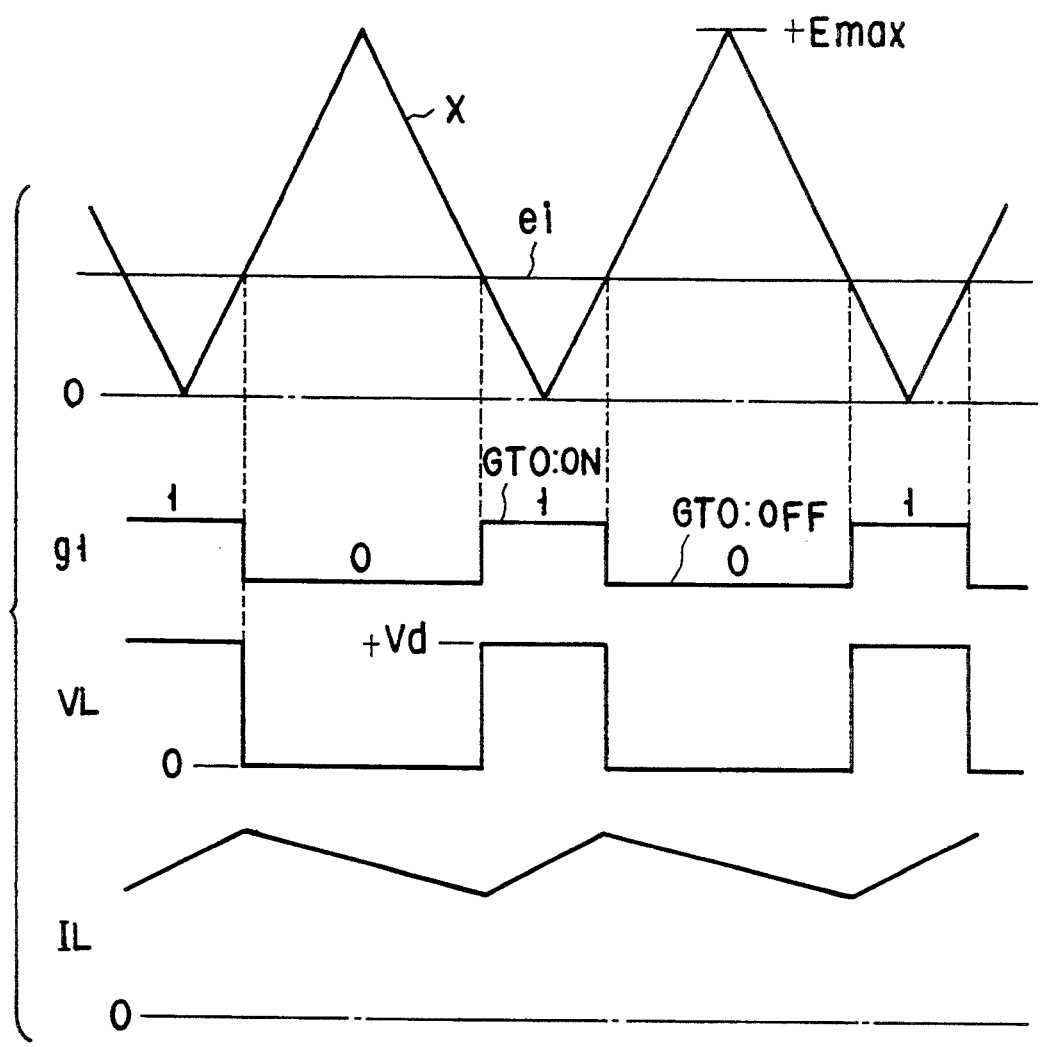
FIG. 2 is a set of operating waveform diagrams for the snubber energy recovery circuit of FIG. 1.

FIG. 2 is a time chart used to explain the PWM control operation. In the figure, reference character X indicates a carrier (triangular wave) signal in PWM control, ei an input signal (a voltage reference signal) supplied from the current-control compensation circuit GL (s), g1 a gate signal to the GTO, VL a voltage applied to the load 1, and IL a load current.

For carrier X, a triangular wave varying in a range from 0 to +Emax is used. The carrier is compared with the input signal ei to form a gate signal g1 to the GTO. Specifically, the GTO operates as follows:

When ei>X, GTO is on for g1=1
When ei<X, GTO is off for g1=0
The voltage VL applied to the load 1 is:
VL= +Vd when GTO is on
VL=0 when GTO is off Thus, the average value of VL is proportional to the input signal ei.

The load current IL increases when the GTO turns on, and flows in a path running through Vd, La, GTO, load, and Vd in that order. When the GTO turns off, the load current IL flows through the free freewheeling diode Df and decreases gradually.

When IL*>IL, the deviation εL becomes positive, which increases the PWM control input signal ei, making the on period of the GTO longer. As a result, the output voltage VL increases, which raises the load current IL so as to provide IL*=IL.

Similarly, when IL*<IL, the deviation εL becomes negative, which decreases the PWM control input signal ei, making the on period of the GTO shorter. As a result, the output voltage VL decreases, which reduces the load current IL so as to provide IL*=IL.

When the GTO turns off, surge voltages are generated due to the existence of the inductance components of the wiring and the anode reactor La. The surge voltages are absorbed by the snubber capacitor Cs.

Hereinafter, the operation of the snubber energy recovery circuit will be explained.

The control circuit CONTo controls the three-phase externally-excited converter SS so that the current Io flowing through the DC reactor Lo may be constant.

Specifically, the current detector CTo senses the current Io flowing through the DC reactor Lo, and supplies the sensed current to the comparator Co. The comparator Co compares the sensed current value Io with the designated current value Io* from the current designation generator VRo, and calculates a deviation of εo=Io*−Io. The deviation so is amplified by the control compensation circuit Go(s), and the resulting e=εo·Go(s) is supplied to the phase-control circuit PHC of the three-phase externally-excited converter SS.

The three-phase externally-excited converter SS regulates the DC output voltage Vo by controlling the firing phase angle a of six thyristors S1 through S6 with respect to a three-phase line voltage. If the primary/secondary winding ratio of the transformer TR is 1:1, and the effective value of the line voltage of the three-phase AC power supply AC-SUP is Vac, the DC voltage Vo will be expressed as:

$Vo = 1.35 \cdot Vac \cdot COS\ \alpha$

The phase control circuit PHC performs phase control based on ordinary cosine comparison, with the result that COS α has a value proportional to the input signal e. Thus, the DC output voltage Vo has a value proportional to the input voltage e. If e is negative, the phase angle will be larger than 90°, and the DC voltage Vo also be negative.

When Io*>Io, the deviation so will be positive, which increases the input e to the phase control circuit PHC. As a result, the DC voltage Vo increases in the direction of arrow in FIG. 3, thereby increasing the DC current Io.

Conversely, when Io*<Io, the deviation so will be negative, which decreases the input e to the phase control circuit PHC. As a result, the DC voltage Vo increases in the opposite direction to that of the arrow in FIG. 3, reducing the DC current Io. Eventually, control is continued so a to provide Io*=Io.

As described above, the DC constant-current source SUP flows the constant current Io in a path running through SS, La, Ds, Do, and SS in that order, irrespective of the charging and discharging of the snubber capacitor Cs. The DC current value Io is selected for a value approximately one digit smaller than the rated output current IL in the main circuit. To decrease ripples in the DC current Io, the inductance value in the DC reactor Lo is selected for approximately 10 mH.

When the GTO is turned on, a current equal to the sum of the load current IL and the DC current Io flows through the GTO. Since the DC constant current Io is one digit smaller than the load current IL, an increase in current in the element becomes less significant.

When the GTO is turned off, the load current IL flowing through the anode reactor La is shut off, and then allowed to flow into the snubber capacitor Cs via the snubber diode Ds to charge this capacitor with the polarity shown.

Next, when the GTO is turned on, the snubber diode Ds is applied with a reverse-bias voltage, permitting the current Io from the DC constant-current source SUP to flow in a path running through SS, La, GTO, Cs, Do, Lo, and SS in that order. This current path remains until the voltage Vc at the snubber capacitor Cs drops to zero. If the current Io is constant, the time ΔTo required for the voltage Vc at the snubber capacitor Cs to become zero is expressed as:

$\Delta To = Vc \cdot Cs / Io$

For example, if Vc=1354 V, Cs=6 μF, and Io=100 A, this gives ΔTo=81 μsec.

When the capacitor voltage Vc=0 is reached, the snubber diode Ds conducts current again, allowing the current Io from the DC constant-current source SUP to flow in a path running through SS, La, Ds, Do, Lo, and SS in that order. After this, the GTO is always ready to be turned off.

The GTO only requires the minimum on time of ΔTo=81 μsec.

Figure 5:
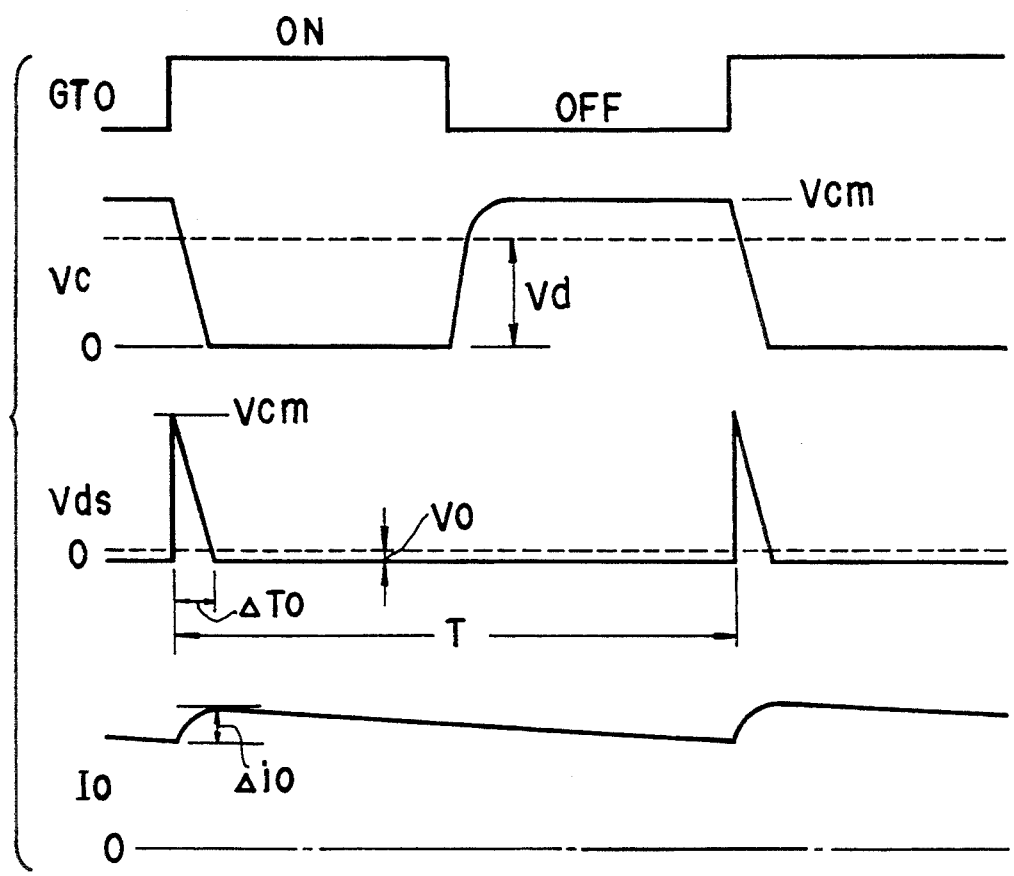
FIG. 5 is a set of operating waveform diagrams for the equivalent circuit of FIG. 4.

FIG. 4 shows an equivalent circuit diagram for explaining the operation of the snubber energy recovery circuit of FIG. 1 apparatus. FIG. 5 shows voltage and current waveforms at various portions of the equivalent circuit of FIG. 4.

The three-phase externally-excited converter SS, which is represented by a regenerative voltage source that generates a voltage Vo of both directions, positive and negative, combines with the DC reactor Lo to form the DC constant-current source SUP.

In the FIG. 4 circuit, when the GTO has turned off, the maximum voltage Vcm charged in the snubber capacitor Cs is the DC voltage Vd added with the voltage corresponding to the energy caused by the current IL flowing through the anode reactor La. That is, the capacitor Cs is applied with the voltage Vcm meeting the following equation:

$(\tfrac{1}{2}) \cdot La \cdot IL^2 = (\tfrac{1}{2}) \cdot Cs \cdot (Vcm^2 - Vd^2)$ For example, if La=20 μH, Cs=6 μH, Vd=1000 V, and IL=500 A, this gives Vcm=1,354 V.

Next, when GTO turns on, the voltage Vcm of the snubber capacitor Cs is applied across the diode Ds. As the diode discharges, the applied voltage Vds to the Ds is also attenuated.

If the DC current Io is constant, the average value of the voltage Vds equals the inverted value $-Vo$ of the output voltage from the three-phase externally-excited converter SS. Specifically, if the discharging time is $\Delta To$, and the switching period of the GTO is T, the voltage Vo will be such that the following equation will be fulfilled:

$$T \cdot Vo = -(\tfrac{1}{2}) \cdot \Delta To \cdot Vcm$$

Substituting $\Delta To = Vcm \cdot Cs/Io$ into this gives:

$$Vo = -(\tfrac{1}{2}) \cdot Cs \cdot Vcm^2/(T \cdot Io)$$

If the switching frequency is 1000 Hz and Io is $Io = 100$ A under the above conditions, this gives $Vo = -55$ V.

In this case, if the circuit losses are neglected because they are sufficiently small, an electric power of approximately 5.5 kW will be recovered to the AC power supply AC-SUP.

By using the value of the DC reactor Lo, the voltage Vc of the snubber capacitor Cs, and the voltage Vo of the three-phase externally-excited converter SS, a ripple $\Delta io$ in the DC current Io is approximated as follows:

$$\Delta io = (Vcm - Vc) \cdot \Delta To / (2Lo)$$

where $\Delta To = T$.

For $Lo = 10$ mH, $\Delta To = 81$ $\mu$sec, and $Vcm - Vo = 1,304$ V, the current ripple will be $\Delta io = 5.3$ A.

From a microscopic point of view, the energy stored in the snubber capacitor Cs is transferred to the DC reactor Lo once, further converted into AC power by the three-phase externally-excited converter SS, and then regenerated to the AC power source AC-SUP.

In this way, the energy stored in the snubber capacitor Cs can be recovered to the DC constant-current source SUP.

As described above, with the present embodiment, since a path is formed which allows current to flow between the junction point of the snubber diode Ds and snubber capacitor Cs and the junction point of the positive terminal of the DC power source Vs and anode reactor La, and the DC constant-current source SUP is provided which maintains the current Io flowing through the path at a constant value, it is possible to discharge the energy stored in the snubber capacitor Cs in a short time without increasing the current flowing in the GTO, thereby shortening the minimum on time of the GTO. As a result, the PWM control range is widened, allowing application to control of high switching frequency.

Figure 6:
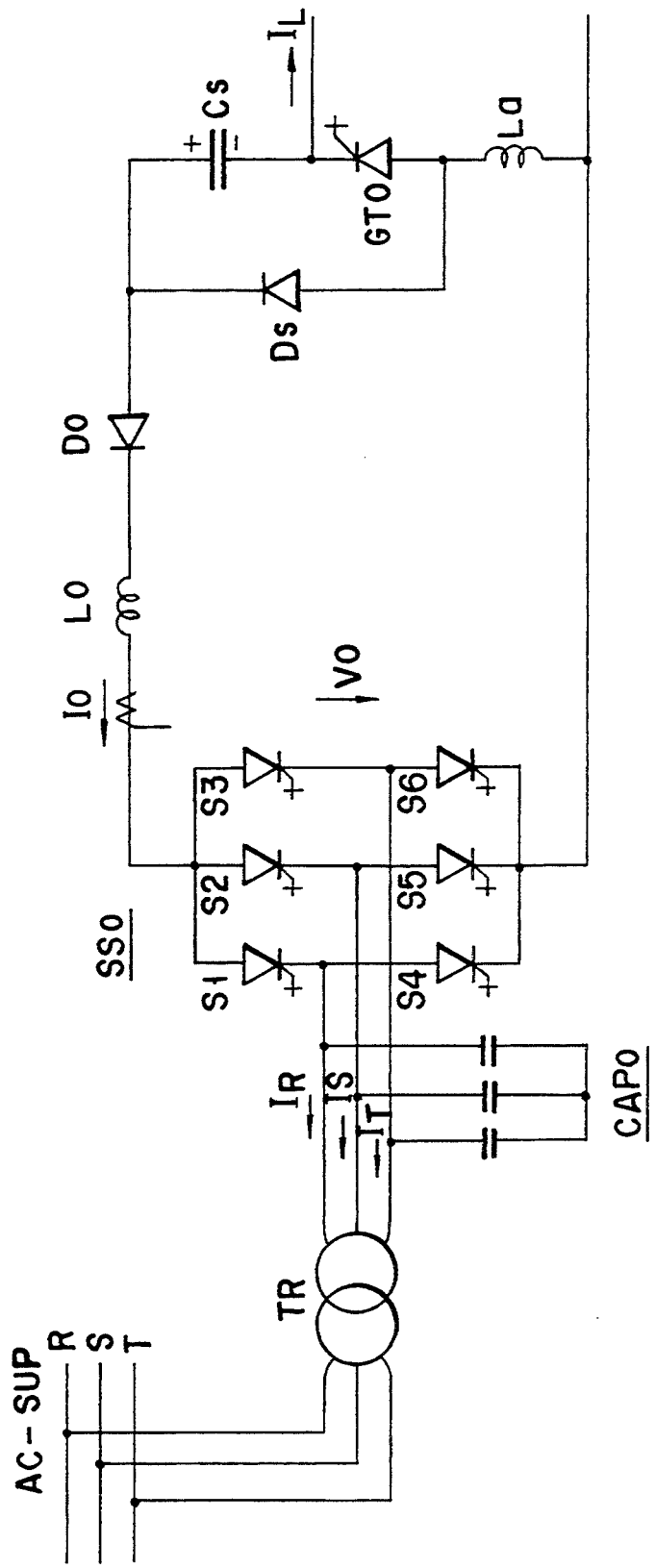
FIG. 6 is a schematic diagram of a DC constant-current source provided with a self-excited converter and a filter capacitor.
Figure 7:
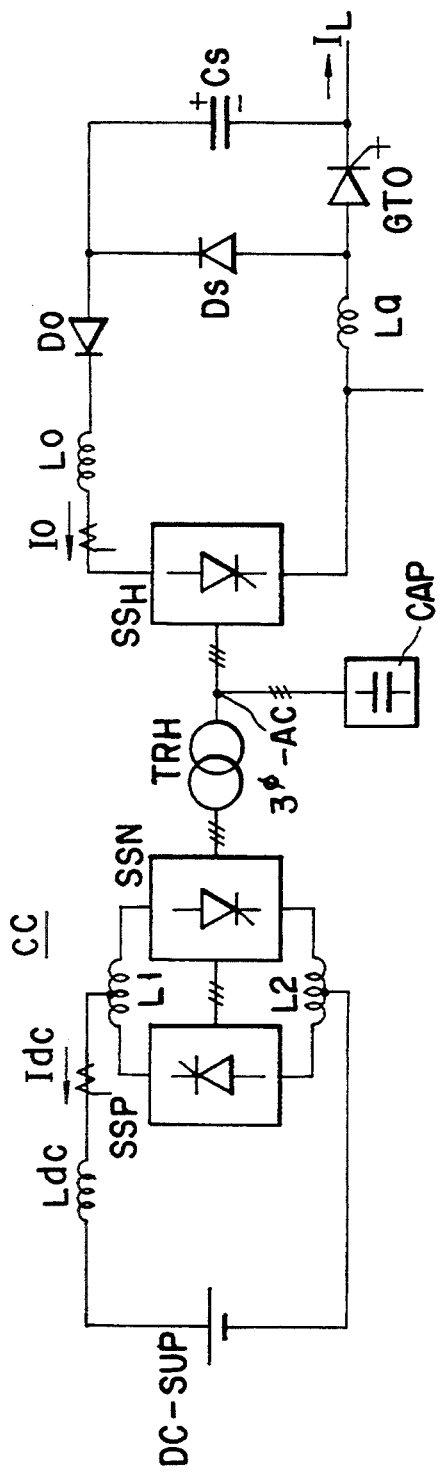
FIG. 7 is a schematic diagram of a DC constant-current source provided with a high-frequency link converter.
Figure 8:
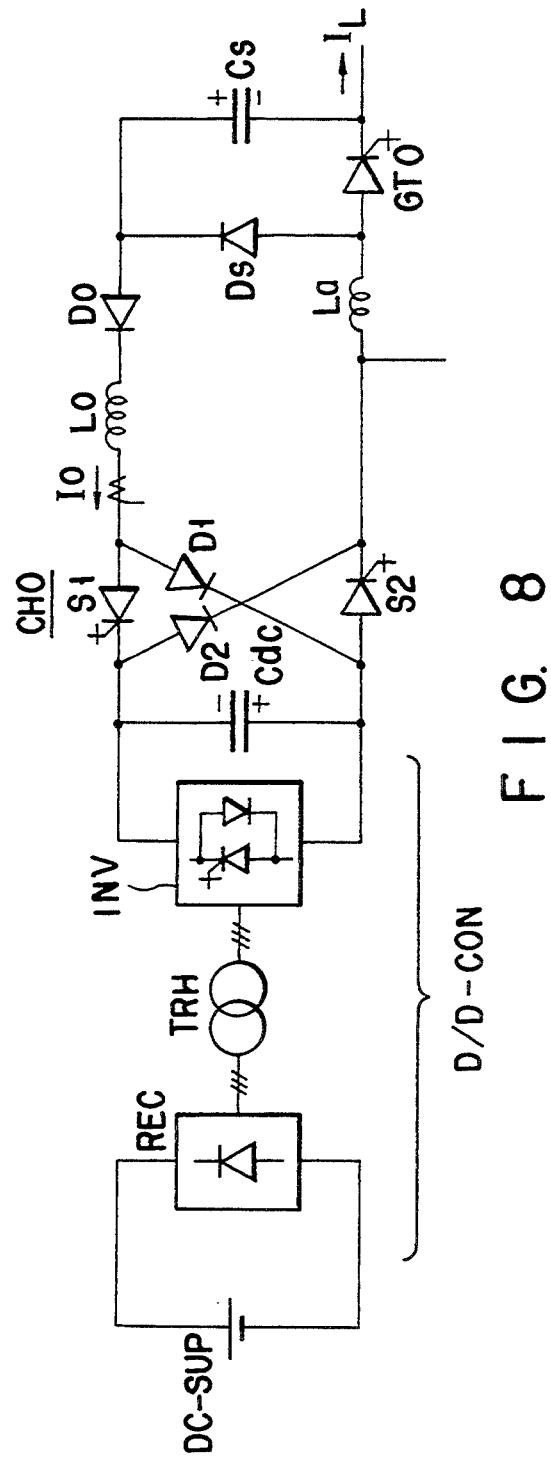
FIG. 8 is a schematic diagram of a DC constant-current source provided with a double chopper circuit and a DC/DC converter.

FIGS. 6 through 8 are schematic diagrams of other embodiments of the DC constant-current source SUP used in a snubber energy recovery circuit of the present invention. In each embodiment, the same parts as those in FIG. 3 are indicated by the same reference characters.

The embodiment shown in FIG. 6 is an example of using a current-type self-excited converter in place of the externally-excited converter shown in FIG. 1. In the figure, CAPo indicates a filter capacitor, and SSo a self-excited converter.

The self-excited converter SSo, which is composed of self turn-off switching devices (for example, transistors or GTOs) S1 through S6, performs pulse-width modulation control (PWM control) in such a manner that AC currents IR, IS, and IT are controlled so that the DC current Io may be almost constant.

The filter capacitor CAPo, which is provided between the self-excited converter SSo and the transformer TR, serves to remove higher harmonic components of the AC currents IR, IS, and IT.

This embodiment is characterized in that the AC current is controlled so as to form a near sine wave that has a small amount of higher harmonic components and an improved power factor, as compared with the externally-excited converter system.

The embodiment of FIG. 7 is an example of using a high-frequency link converter. In the figure, reference characters DC-SUP indicate a DC power source, CC a circulating current type double converter, CAP a high-frequency capacitor, TRH a high-frequency transformer, and SSH an externally-excited converter.

This system is effective in recovering the snubber energy to the DC power source DC-SUP.

The circulating current type double converter CC, which is made up of a positive-group converter SSP, a negative-group converter SSN, and DC reactors L1 and L2, controls the DC source current Idc so that the voltage peak value Vcap of the high-frequency capacitor CAP may be almost constant. By controlling the circulating current Icc in the circulating current type double converter CC, the lagging reactive power Qcc on the high-frequency power supply side can be regulated.

The circulating current type double converter CC that removes the lagging reactive power Qcc can be considered as a kind of inductance. By means of a resonance phenomenon caused by this inductance and the high-frequency capacitor CAP, a high-frequency power supply can be established.

The circulating current type double converter CC and externally-excited converter SSH provide natural commutation, making use of the voltage of this high-frequency power source.

Once the high-frequency power source has been established, it can combine with the DC reactor Lo to constitute the DC constant-current source SUP, since the externally-excited converter SSH is prepared as explained in FIG. 1.

In this case, the energy in the snubber capacitor Cs is transferred to the high-frequency capacitor CAP by means of the DC reactor Lo and externally-excited converter SSH, and then recovered to the DC power source DC-SUP by the circulating current type double converter CC.

This system is characterized by recovery to the DC power source DC-SUP, natural commutation by the circulating current type double converter CC and externally-excited converter SSH, and the compact, lightweight design because of the insulating transformer TRH composed of a high-frequency transformer.

The embodiment of FIG. 8 is an example of using a double chopper circuit and a DC/DC converter. In the figure, reference characters DC-SUP indicate a DC power source, D/D-CON a DC/DC converter, Cdc a DC smoothing capacitor, and CHO a double chopper circuit.

The DC/DC converter D/D-CON is made up of a rectifier REC, a high-frequency transformer TRH, and a voltage-type PWM inverter INV.

The double chopper circuit CHO, which is composed of self turn-off switching devices S1 and S2, and free-wheeling diodes D1 and D2. The gates of the self turn-off switching devices S1 and S2 are controlled by the load-current control circuit CONTo not shown (see FIG. 1) so that the DC current Io may be almost constant.

When the self turn-off switching devices S1 and S2 are both on, the DC current Io flows in a path running through Lo, S1, Cdc, S2, La, Ds, Do, and Lo in that order (or a path running through Lo, D1, Cdc, S2, La, GTO, Cs, Do, and Lo in that order), which decreases the voltage of the DC smoothing capacitor Cdc, thus increasing Io.

When both self turn-off switching devices S1 and S2 are turned off, the DC current Io flows in a path running through Lo, D1, Cdc, D2, La, Ds, Do, and Lo in that order (or a path running through Lo, D1, Cdc, D2, La, GTO, Cs, Do, and Lo in that order), which increases the voltage of the DC smoothing capacitor Cdc, thus reducing Io.

When either self turn-off switching device S1 or S2 is on, the DC current Io is in the returning mode without passing through the DC smoothing capacitor Cdc.

The voltage-type PWM inverter INV converts the DC voltage at the DC smoothing capacitor Cdc into a high-frequency AC voltage, which is then stepped up in insulation by the high-frequency transformer TRH, rectified by the rectifier REC, and then recovered to the DC power source DC-SUP.

Specifically, the energy in the snubber capacitor Cs is stored in the DC smoothing capacitor Cdc once via the DC reactor Lo and double chopper circuit CHO, and then recovered to another DC power source DC-SUP insulated by the DC/DC converter D/D-CON.

The DC power source DC-SUP may be replaced with the DC power source Vd of the FIG. 1 main circuit.

This system is characterized by recovery to the DC power source and the compact, lightweight design because of the high-frequency insulating transformer.

In the embodiment of FIG. 9, the main circuit is composed of a chopper circuit, with two self turn-off switching devices connected in series in the main circuit. In the figure, the same parts as those in FIG. 1 are indicated by the same reference characters. The GTO1 is connected in parallel with a snubber circuit made up of a snubber diode Ds1 and a snubber capacitor Cs1. Similarly, the GTO2 is connected in parallel with a snubber circuit composed of a snubber diode Ds2 and a snubber capacitor Cs2. The junction point of the snubber diode Ds1 and snubber capacitor Cs1 is connected to one end of the reactor Lo via a recovery diode Do1 in a forward direction. The junction point of the snubber diode Ds2 and snubber capacitor Cs2 is connected to the anode of the recovery diode Do1 via a recovery diode Do2 in a forward direction.

The self turn-off switching devices GTO1 and GTO2 are turned on and off simultaneously to control the current IL flowing through the load 1.

When the GTO1 and GTO2 are turned off, the energy of the load current flowing through the anode reactor La is transferred to the snubber capacitors Cs1 and Cs2 via the snubber diodes Ds1 and Ds2. At this time, the DC current Io flows in a path running through Lo, SS, La, Ds1, Do1, and Lo in that order.

Next, when the GTO1 and GTO2 are turned on, a reverse bias voltage is applied to the snubber diodes Ds1 and Ds2, which allows the DC current Io to flow in a path running through Lo, SS, La, GTO1, Cs1, Do1, and Lo in that order, thus discharging the voltage Vc1 of the upper snubber capacitor Cs1. As a result, the voltage Vc2 of the lower snubber capacitor Cs2 is higher than Vc1, which allows the DC current Io to flow in a path running through Lo, SS, La, GTO1, GTO2, Cs2, Do2, Do1, and Lo in that order, thus discharging the voltage Vc2 of the lower snubber capacitor Cs2. Consequently, this connects the two snubber capacitors in parallel, permitting the discharging by the DC current Io.

In this case, it is necessary to flow nearly two times as much current as that in the embodiment in FIG. 1.

While in the previous explanation, the number of series-connected self turn-off switching devices is two, three or more elements may be used in a similar manner.

Figure 10:
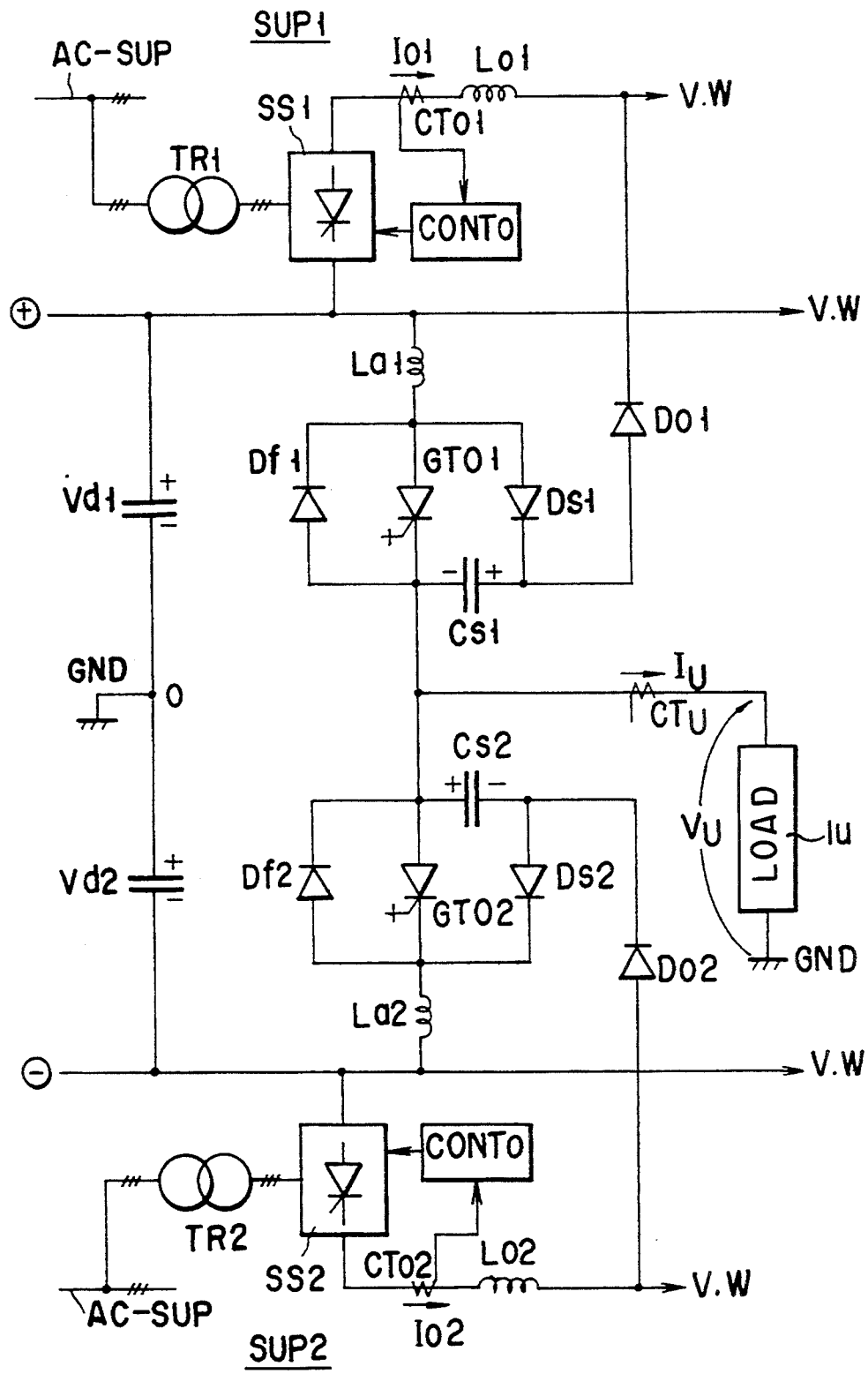
FIG. 10 is a schematic diagram of an embodiment in which a snubber energy recovery circuit associated with the present invention is applied to a voltage-type converter.

In the embodiment shown in FIG. 10, snubber energy recovery circuit of the present invention is used in voltage-type inverter that converts DC power into AC power of a variable voltage and a variable frequency. In the figure, the configuration of only one phase (U phase) is shown, and those of the remaining phases are omitted. It will be appreciated that those skilled in the art can easily achieve the other configurations on the basis of the configuration of one phase shown in FIG. 10. In the FIG. 10, the same parts as those in FIG. 9 are indicated by the same reference characters.

In the voltage-type inverter of FIG. 10, two main DC power sources Vd1 and Vd2 are connected in series. Connected across the series-connected DC power sources is a series circuit that contains an anode reactor La1, a GTO1, a GTO2, and an anode reactor La2. The junction point of the GTO1 and GTO2 is connected to one end of a load 1 of U phase the other end of which is connected to the ground, with the junction between the DC power sources Vd1 and Vd2 connected to the ground.

Each of the GTO1 and GTO2 is provided with a snubber energy recovery circuit constructed in a similar manner to the FIG. 1 embodiment. Each component of the snubber energy recovery circuit for GTO1 and GTO2 is indicated by reference characters followed by "1" and "2", respectively, for distinction. Each component has the same function as that of the embodiment of FIG. 1.

Figure 11:
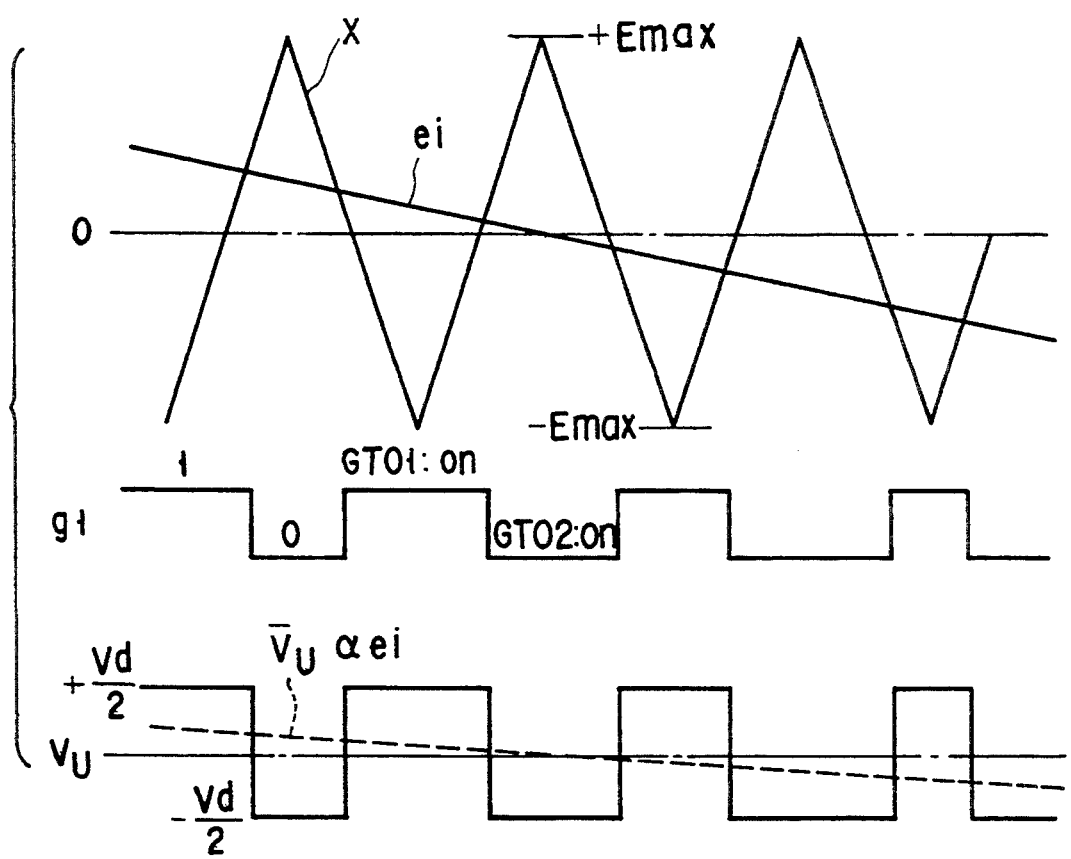
FIG. 11 is a set of operating waveform diagrams for the snubber energy recovery circuit of FIG. 10.

FIG. 11 shows voltage waveforms at various portions when the inverter of FIG. 10 undergoes pulse-width modulation control (PWM control).

In PWM control, carrier (triangular wave) X is compared with the output voltage reference ei and a gate signal g1 to the self turn-off switching devices GTO1 and GTO2 is produced.

The GTO1 and GTO2 operate as follows:
When $ei > X$, GTO1 turns on (GTO2 turns off) for $g1 = 1$
When $ei < X$, GTO1 turns off (GTO2 turns on) for $g = 0$ If the DC voltage is $Vd1 = Vd2 = Vd/2$, the voltage Vu applied to U-phase load $1u$ will be:
$Vu = +Vd/2$, when GTO1 turns on (GTO2 turns off)
$Vu = -Vd/2$, when GTO1 turns off (GTO2 turns on)

The average value (shown by broken line) of the output voltage Vu is proportional to the output voltage reference ei.

Therefore, when a sine-wave voltage is given as the output voltage reference ei, the voltage Vu applied to the U-phase load will take the form of a sine wave. Normally, the above voltage reference ei is given so as to control the current Iu in the U-phase load to produce a sine wave.

Those related to V phase and W phase are also constructed in the same manner, with the result that an AC power of a variable voltage and a variable frequency can be supplied to the three-phase load as a whole.

In such a converter, the upper self turn-off switching device GTO1 is provided with a snubber energy recovery circuit connected to the positive line (+) of the DC power source Vd, and the lower self turn-off switching device GTO2 is provided with a snubber energy recovery circuit connected to the negative line (−) of the DC power source Vd.

The upper snubber energy recovery circuit operates similarly to that shown in FIG. 1. In this case, the AC power source AC-SUP, transformer TR1, externally-excited converter SS1, DC reactor Lo1, current detector CTo1, and current control circuit CONT1 constitute a first DC constant-current source SUP1, which controls the DC current Io1 so that the current may be almost constant. The snubber energy recovery circuit for the upper self turn-off switching device of each of V phase and W phase can share the DC constant-current source SUP1 via the respective recovery diodes.

Since in the lower snubber energy recovery circuit, the applied voltage to the snubber capacitor Cs2 has a polarity shown, the recovery diode Do2 and externally-excited converter SS2 follow the shown direction accordingly. The remaining components operate similarly to the upper snubber energy recovery circuit. The snubber energy recovery circuit for the lower self turn-off switching device of each of V phase and W phase can share a second DC constant-current source SUP2 via the respective recovery diodes.

Although in the embodiment of FIG. 10, the present invention is applied to the three-phase four-wire type, it may be applicable to the three-phase three-wire type.

Further, the present invention may also be applied to a snubber energy recovery circuit in the upper and lower arms of a neutral point clamped inverter that generates three-level output voltages.

Additionally, besides the PWM inverter explained above, the present invention may, of course, be applied to PWM converters in a similar manner.

Figure 12:
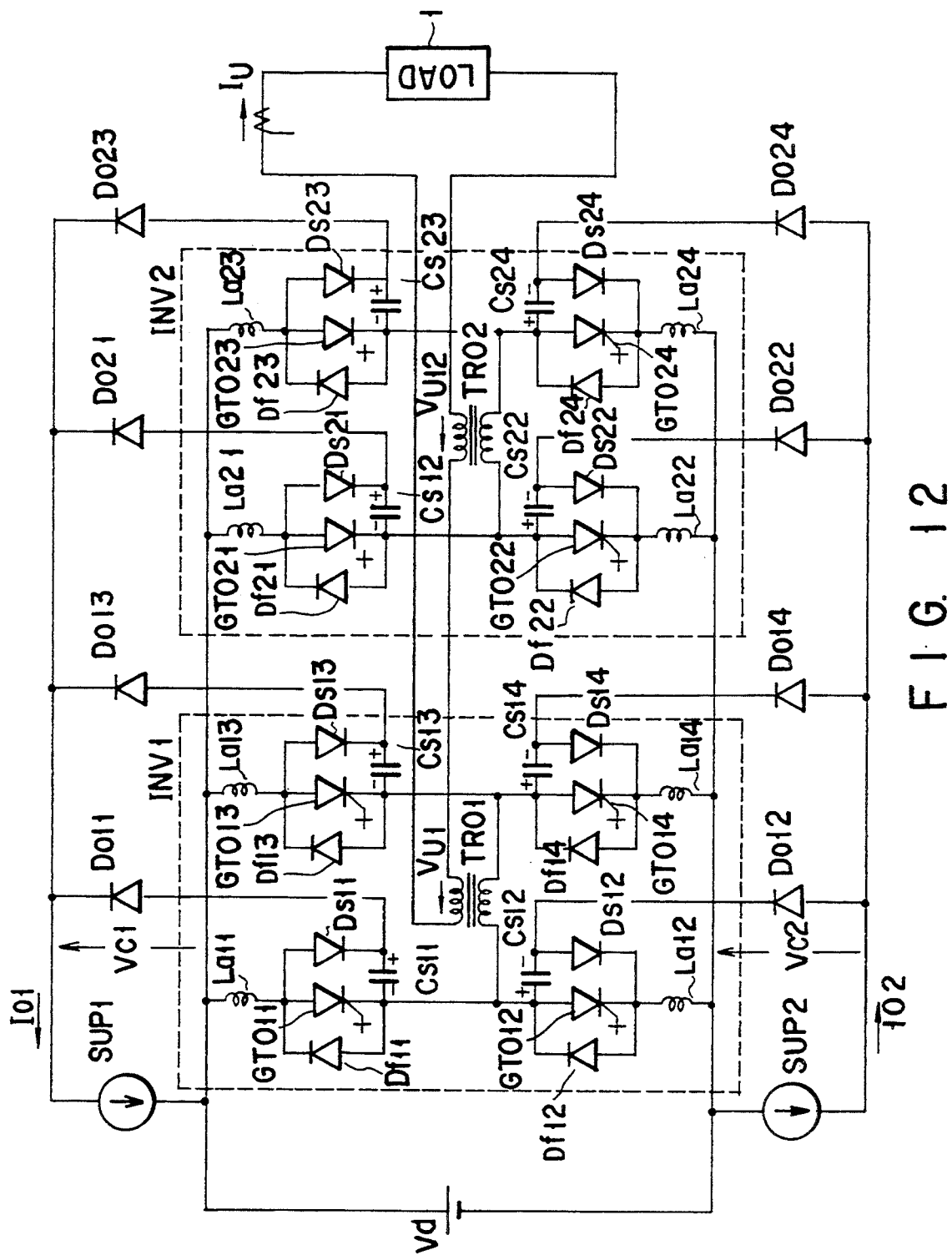
FIG. 12 is a schematic diagram of an embodiment in which a snubber energy recovery circuit associated with the present invention is applied to a multiple PWM control inverter.

FIG. 12 is a schematic diagram of still another embodiment of a snubber energy recovery circuit of the present invention. In this embodiment, the invention is applied to a multiple PWM control inverter. In the figure, only one phase is shown.

In FIG. 12, reference characters Vd indicate a main DC power source, INV1 and INV2 PWM control inverters connected in a full bridge, TRO1 and TR02 output transformers, LOADu a U-phase load, Do11 through Do14, and Do21 through Do24 recovery diodes, and SUP1 and SUP2 DC constant-current sources.

Each component of a first DC constant-current source SUP1 is indicated by reference characters of FIG. 1 DC constant-current source SUP followed by "1." Similarly, each component of a second DC constant-current source SUP2 is indicated by reference characters of FIG. 1 DC constant-current source SUP followed by "2." They have the same construction as that of FIG. 1 power source.

The transformer TRo1 connected to the output terminal of the first inverter INV1 and the transformer TRo2 connected to the output terminal of the second inverter INV2 are connected in series on the secondary side, supplying a voltage of Vu=Vu1+Vu2 to the load $1u$.

Figure 13:
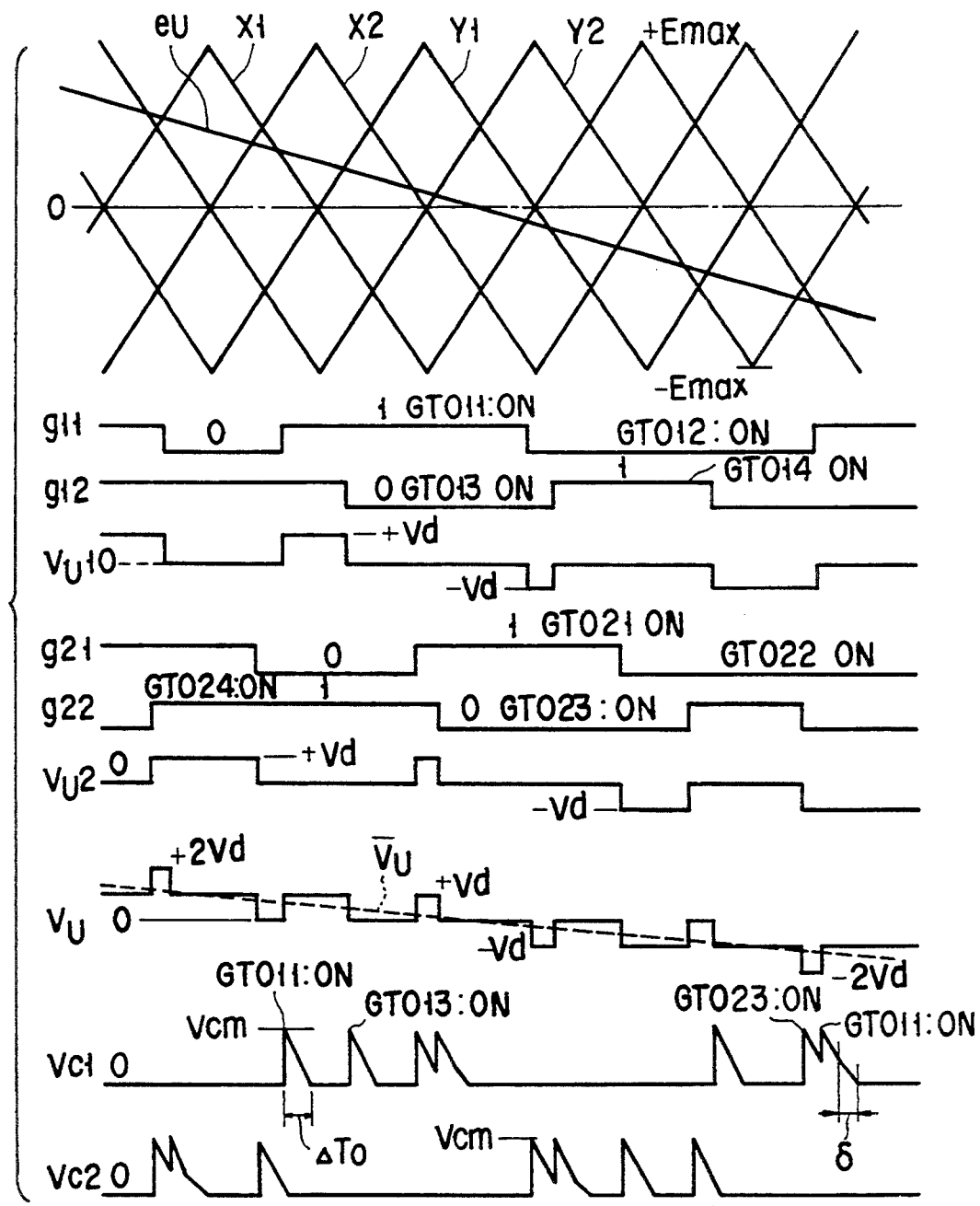
FIG. 13 is a set of operating waveform diagrams for the snubber energy recovery circuit of FIG. 12.

FIG. 13 is a time chart for explaining the PWM control operation of the FIG. 12 apparatus.

X1, X2, Y1, and Y2, which are carrier signals (triangular waves) for PWM control, are spaced at 90° phase intervals. The input signal eu for PWM control is compared with those triangular waves to produce the gate signals to inverters INV1 and INV2. Specifically, by comparing the input signal eu with triangular waves X1 and Y1, the gate signals g11 and g12 to the self turn-off switching devices GTO11 and GTO14 constituting the first inverter INV1 are produced:

When eu>X1, GTO11 turns on (GTO12 turns off) for g11=1

When eu<X1, GTO11 turns off (GTO12 turns on) for g11=0

When eu>Y1, GTO14 turns on (GTO13 turns off) for g12=1

When eu<Y1, GTO14 turns off (GTO13 turns on) for g12=0

When DC voltage is Vd, the output voltage Vu1 of the first inverter INV1 will be:

Vu1=+Vd when both GTO11 and GTO14 are on

Vu1=−Vd when both GTO12 and GTO13 are on

Vu1=0 in the other modes

The average value of the output voltage Vu1 is proportional to the input signal eu. The second inverter INV2 is simiraly controlled with INV1.

The load $1u$ is applied with the sum of the output voltages of the two inverters INV1 and INV2: Vu=-Vu1+Vu2, via the output transformers TRO1 and TR02.

If each of the self turn-off switching devices GTO11 through GTO14, and GTO21 through GTO24 has a switching frequency of 1 KHz, an equivalent carrier frequency of the applied voltage to the load $1u$ is 4 kHz.

The self turn-off switching devices GTO11 through GTO14, and GTO21 through GTO24 are provided with snubber capacitors Cs11 through Cs14, Cs21 through Cs24, and snubber diodes Ds11 through Ds14, Ds21 through Ds24, and recovery diodes Do11 through Do14, Do21 through Do24, respectively. The recovery diodes Do11, Do13, Do21, and Do23 in the upper arm are connected to the first DC constant-current source SUP1, and the recovery diodes Do12, Do14, Do22, and Do24 in the lower arm are connected to the second DC constant-current source SUP2.

Since in the multiple PWM inverter, the switching timings of self turn-off switching devices GTO11 through GTO14, GTO21 through GTO24 are shifted from each other, the upper-side voltage Vc1 and the lower-side voltage Vc2 generated via the recovery diodes are as shown at the bottom of FIG. 13. When the self turn-off switching devices GTO11, GTO13, GTO21, and GTO23 turn on, the upper-side voltage Vc1 has a peak value of Vcm and decreases for a duration of ΔTo. When the on timing of two elements overlaps each other, the higher of the voltages of the two snubber capacitors is generated. When the two capacitors have the same voltage, those two capacitors are connected in parallel, being discharged. During the discharging time δ in the parallel connection, the voltage attenuation coefficient is halved.

If the switching frequency of the self turn-off switching device is 1 KHz, the pulse period T of the voltage Vc1 supplied to the upper-side DC constant-current source SUP1 will be T=250 μsec=¼ KHz. If Cs=6 μF, Vcm=1,354 V, and Io=100 A, the voltage Vo of the externally-excited converter will be:

$$Vo = -(\tfrac{1}{2}) \cdot Cs \cdot Vcm^2/(T \cdot Io)$$
$$= -220 \text{ V}$$

This holds true for the lower-side DC constant-current source SUP2. In this case, if the circuit losses are small enough to be neglected, a total power of 44 KW will be recovered to the AC power supply AC-SUP.

While in the FIG. 12 embodiment, multiple operation of two full bridge-connected inverters is explained, the present invention may be applied to other multiple PWM control operations in a similar manner.

Figure 14:
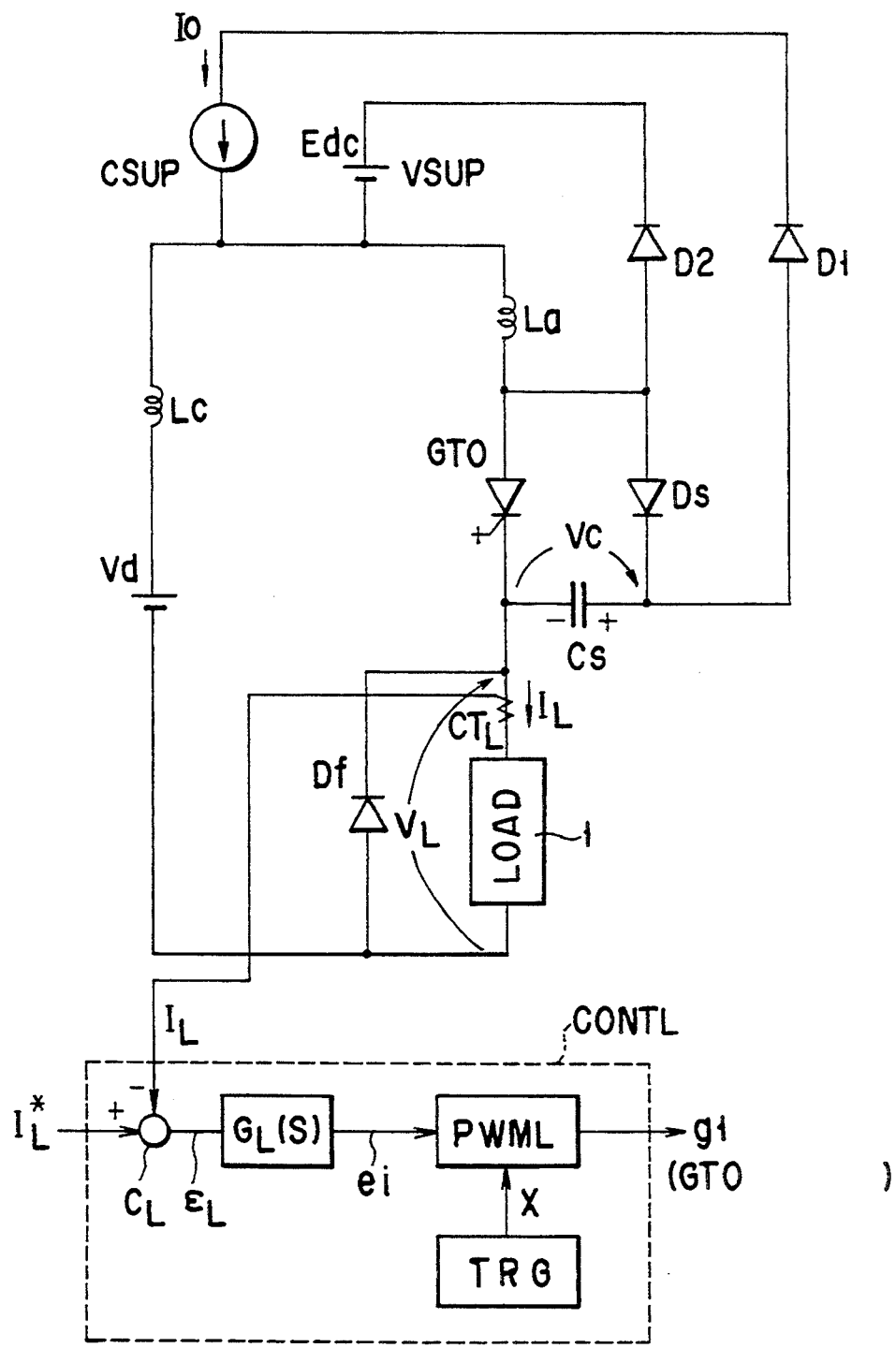
FIG. 14 is a schematic diagram of an embodiment in which a snubber energy recovery circuit associated with the present invention is applied to a chopper circuit.

FIG. 14 shows a snubber energy recovery circuit associated with a second embodiment of the present invention, in which the snubber energy recovery circuit is applied to a chopper circuit. The same parts as those in the FIG. 1 embodiment are indicated by the same reference characters.

In this embodiment, the positive terminal of the DC power source Vd is connected to the anode of a GTO via an anode reactor La for current suppress. Reference characters Lc indicate wiring inductance. The junction point of a snubber diode Ds and a snubber capacitor Cs is connected to the junction of the anode reactor La and the positive terminal of the DC power source Vd via a first recovery diode D1 and a DC constant-current source CSUP.

Second recovery diode D2, which is connected to a junction point of the anode of the GTO and reactor La, is connected to a point between the junction of a positive terminal of the DC side and the anode reactor La via a a DC constant-voltage source VSUP.

Since the control operation of load current IL has already been explained in the FIG. 1 embodiment, its explanation will be omitted here.

The operation of the snubber energy recovery circuit will be explained.

The DC constant-current source CSUP, when the GTO is off, is controlled so as to flow a constant current in a path running through CSUP, La, Ds, D1, and CSUP in that order.

When the GTO turns on, the energy stored in the inductance of the wires and the anode reactor La for current control is transferred to the snubber capacitor Cs via the snubber diode Ds.

When the charging voltage Vc at the snubber capacitor becomes high, the energy in the reactor La for current suppression is recovered to the DC constant-voltage source VSUP via a second recovery diode D2. That is, the voltage generated by the current suppression reactor La is suppressed to the voltage Edc of the DC constant-voltage source VSUP.

In the case of the FIG. 14 chopper circuit, the maximum value Vcm of the voltage charged in the snubber capacitor Cs equals the sum of the main DC voltage Vd, the voltage ΔE caused by the inductance of the wires, and the voltage Edc of the DC constant-voltage source VSUP:

$$Vcm = Vd + \Delta E + Edc$$

$$\Delta E = Lc \cdot (di/dt)$$

The voltage Edc of the DC constant-voltage source VSUP is selected for a value about one digit smaller than the main DC power source Vd. With ΔE being sufficiently small, if, for example, Vd=3,000 V and Edc=300 V, then this gives Vcm=3,300 V.

The DC constant-voltage source VSUP, which is a voltage source capable of power recover, is composed of, for example, a DC smoothing capacitor, a DC/DC converter, and others. Therefore, the energy in the current suppression reactor La is first transferred to the snubber capacitor Cs, and then most of the energy is recovered to the DC constant-voltage source VSUP.

Next, when the GTO turns on, the current Io from the DC constant-current source CSUP flows in a path running through CSUP, La, GTO, Cs, D1, and CSUP. Namely, the voltage Vc at the snubber capacitor Cs will be discharged at a constant current Io. The DC current Io is selected for a value nearly one digit smaller than the rated output current (load current) IL in the main circuit.

When the GTO turns on, the GTO carries a current equal to the sum of the load current IL and the DC current Io. Because the DC constant current Io is one digit lower than the load current, an increase in current in the element becomes less significant.

If the current Io is constant, the time ΔTo required for the voltage Vc of the snubber capacitor Cs to become zero is expressed as:

$$\Delta To = Vc \cdot Cs/Io$$

For instance, if Vc=3,000 V, Cs=6 μF, and Io=200 A, this will give ΔTo=90 μsec.

When the capacitor voltage Vc becomes Vc=0, the snubber diode Ds conducts current again, the current Io from the DC constant-current source CSUP flows in a path running through CSUP, La, Ds, D1, and CSUP in that order. After this, the GTO is always ready to be turned off.

The GTO only requires the minimum on time of ΔTo=90 μsec.

Figure 15:
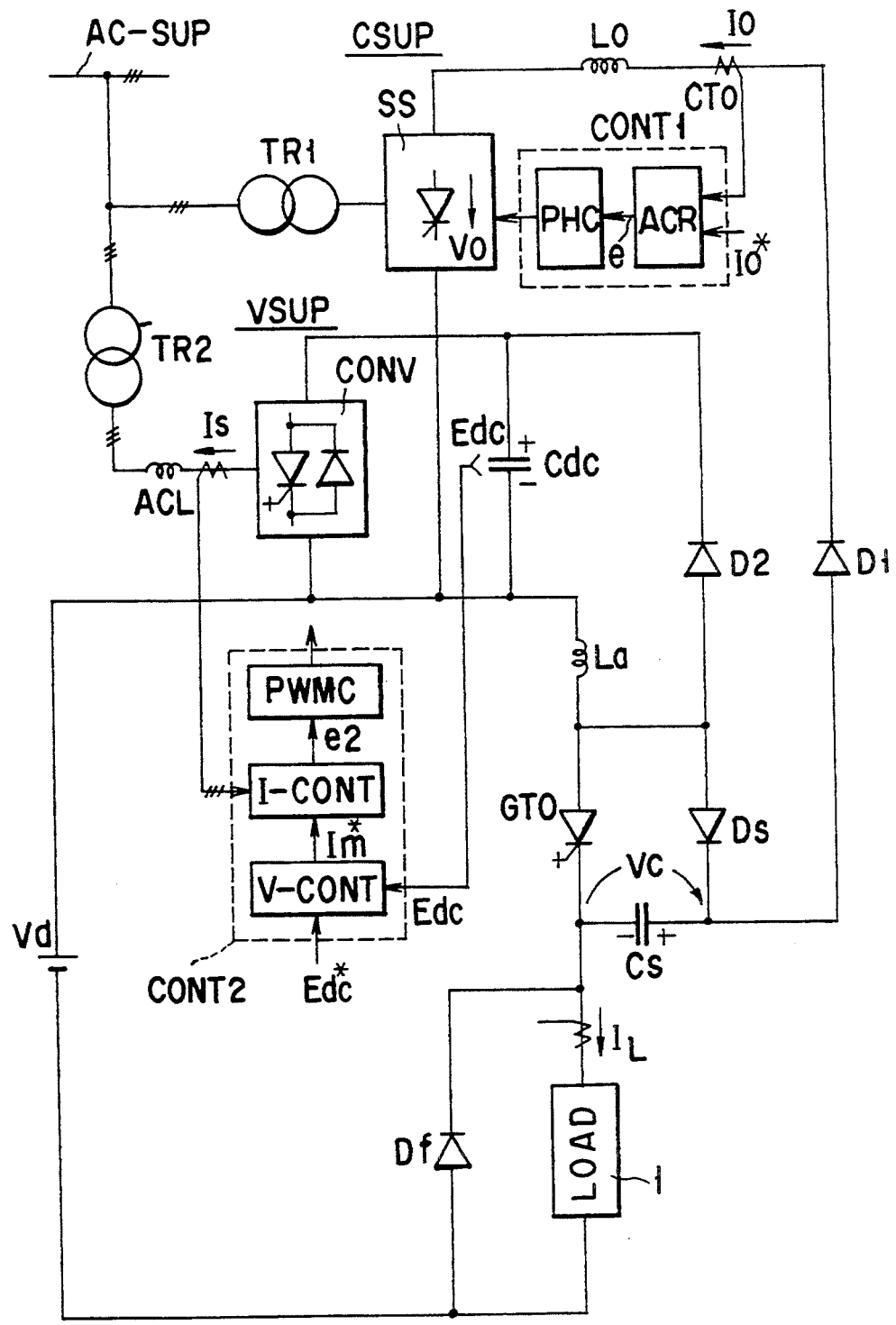
FIG. 15 is a diagram showing a concrete construction of the snubber energy recovery circuit of FIG. 14.

The DC current power source CSUP is composed of, for example, an AC power source AC-SUP, an AC-to-DC power converter SS, and a DC reactor Lo as shown in FIG. 15. The energy of $(\tfrac{1}{2}) \cdot Cs \cdot Vc^2$ in the snubber capacitor Cs is first transferred to the DC reactor Lo, and then converted into AC power by the AC-to-DC power converter SS, and finally recovered to the AC power source AC-SUP.

In this way, the energy stored in the snubber capacitor Cs can be recovered to the DC constant-current source.

With a snubber energy recovery circuit of the present invention, an increase in current in the GTO is small, and the discharging time of the snubber capacitor Cs can be shortened.

FIG. 15 is a schematic diagram of a more concrete embodiment of the FIG. 14 apparatus.

A first control circuit CONT1, which is made up of a current control circuit ACR and a phase control circuit PHC, controls an externally-excited converter SS so that the current Io flowing the DC reactor Lo may be constant.

A second control circuit CONT2, which is composed of a voltage control circuit V-CONT, an input current control circuit I-CONT, and a pulse-width modulation control circuit PWMC, controls a self-excited converter CONV so that the voltage Edc of the DC smoothing capacitor Cdc may be constant.

First, the operation of the first control circuit CONT1 will be explained.

A current detector CTo senses the current Io flowing through the DC reactor Lo and supplies it to the current control circuit ACR. The current control circuit ACR compares the designated current value Io* with the sensed current value Io to obtain a deviation of $\epsilon o = Io^* - Io$. The deviation $\epsilon o$ is amplified by the control compensation circuit Go(s) (not shown) in the current control circuit ACR, and the resulting value $e = \epsilon o \cdot Go(s)$ is supplied to the phase control circuit PHC Of the externally-excited converter SS.

The externally-excited converter SS, which is a three-phase bridge-connected thyristor converter, regulates the DC output voltage Vo by controlling the firing phase angle a of each of six thyristors S1 through S6 with respect to the three-phase line voltage. If the primary/secondary winding ratio of the transformer TR1 is 1:1 and the effective value of the line voltage of the three-phase AC power source is Vac, the DC voltage Vo will be expressed as:

$$Vo = 1.35 \cdot Vac \cdot \cos a$$

The phase control circuit PHC is based on normal cosine wave comparison, and cos a has a value proportional to the input signal e. Therefore, the DC output voltage Vo has a value proportional to the input signal e. If e has a negative value, the phase angle a becomes larger than 90°, and the DC voltage Vo also has a negative value.

When Io*>Io, the deviation so becomes positive, increasing the input e to the phase control circuit PHC. As a result, the DC voltage Vo increases in the direction of arrow in FIG. 3, increasing the DC current Io.

Conversely, when Io*<Io, the deviation $\epsilon o$ has a negative value, decreasing the input e to the phase control circuit PHC. As a result, the DC voltage Vo increases in the opposite direction to the arrow in FIG. 3, reducing the DC current Io. Control is continued until Io*=Io is reached.

As mentioned above, the DC constant-current source CSUP flows a constant DC current Io independently of the charging and discharging of the snubber capacitor Cs. The DC current value Io is selected for a value nearly one digit smaller than the rated current IL in the main current. To reduce ripples in the DC current, the inductance of the DC reactor Lo is selected for a value of approximately 10 mH.

When the GTO is turned on, the GTO carries a current equal to the sum of the load current IL and the DC constant current Io. Since the DC constant current Io is one digit smaller than the load current IL, an increase in current in the element becomes less significant.

The operation of the second control circuit CONT2 will be explained.

The voltage Edc at the DC smoothing capacitor Cdc is sensed and supplied to the voltage control circuit V-CONT. The voltage control circuit V-CONT compares the designated DC voltage value Edc* with the sensed voltage value Edc, amplifies the deviation $\epsilon v = Edc^* - Edc$, and produces a peak value designation of AC current. By multiplying the peak value designation Im* by a unit sine wave (sin ωt) synchronized with the voltage of the AC power supply AC-SUP, the designated AC current value Is*=Im* sin ωt is produced. The direction of current is selected so that Im* may be positive and the power be returned to the AC power supply AC-SUP, or the power be regenerated. The AC current control circuit I-CONT compares the designated current value Is* with the sensed current value Is, amplifies the deviation $\epsilon 1 = Is^* - Is$, and supplies the amplified signal to the PWM control circuit PWMC.

The self-excited converter CONV performs PWM control to produce a voltage proportional to the output signal e2 from the AC current control circuit I-CONT, thereby causing Is=Is*.

When Edc*<Edc, the deviation $\epsilon v$ becomes negative, which increases the peak value designation Im* of AC current, causing the energy in the smoothing capacitor Cdc to be regenerated to the AC power supply AC-SUP.

When Edc*>Edc, the deviation $\epsilon v$ becomes positive, which makes the peak value designation Im* of AC current negative, allowing the power to be supplied from the AC power source AC-SUP to the DC smoothing capacitor Cdc. This permits the voltage Edc at the DC smoothing capacitor Cdc to remain constant.

When the GTO turns off, the load current component IL flowing in the anode reactor La is shut off, and then flows into the snubber capacitor Cs via the snubber diode Ds to charge the capacitor with the polarity shown.

When the inductance of the wires is ignored, the maximum value of the voltage Vc charged in the snubber capacitor Cs equals the sum of the main DC voltage Vd and the voltage Edc of the DC smoothing capacitor Cdc. When Vc=Vd+Edc is reached, the second recovery diode D2 conducts current, allowing the current in the anode reactor La to flow toward the DC smoothing capacitor Cdc. As a result, the DC voltage Edc increases to cause Edc*<Edc, permitting the power to be recovered to the AC power supply AC-SUP as noted earlier.

As a result of part of the energy in the anode reactor La being transferred to the snubber capacitor Cs, the current in the anode reactor La attenuates from IR1 to IR2 as expressed by the following equation:

$$(\tfrac{1}{2})La(IR1^2 - IR2^2) = (\tfrac{1}{2})Cs(Vcm^2 - Vd^2)$$

For example, if IR1=1,500 A, Vcm=3,300 V, Vd=3,000 V, La=20 μH, and Cs=6 μF, this gives IR2=1,297 A.

The current IR2 is recovered to the DC smoothing capacitor Cdc, and eventually attenuates until IR=Io is reached. Io is a constant current supplied from the DC constant-current source CSUP.

The time ΔTR required for the current in the anode reactor La to attenuate from IR2 to Io is determined by the following equation using the voltage Edc of the smoothing capacitor Cdc:

$$\Delta TR = (IR2 - Io) \cdot La/Edc$$

For example, if IR2=1,297 A, Io=200 A, Edc=300 V, and La=20 μH, ΔTR will be ΔTR=73 μsec.

After the current in the anode reactor La reaches IR=Io, the GTO may be turned on at any time.

When the GTO is turned on, a reverse bias voltage is applied to the snubber diode Ds, allowing the current Io from the DC constant-current source CSUP to flow in a path running through SS, La, GTO, Cs, D1, Lo, and SS in that order. This path remains until the voltage Vs at the snubber capacitor Cs becomes zero.

When capacitor voltage Vc=0 is reached, the snubber diode Ds conducts current again, enabling the current Io from the DC constant-current source CSUP to flow in a path running through SS, La, Ds, D1 Lo, and SS in that order. After this, The GTO is always ready to be turned off.

In this way, the energy stored in the snubber capacitor Cs is recovered to the DC constant-current source CSUP, and most of the energy in the anode reactor La is recovered to the DC constant-voltage source VSUP. At this time, the maximum voltage Vcm applied to the snubber capacitor Cs, when the inductance of the wires is ignored, can be suppressed to Vd+Edc. In addition, the current IGTO when the GTO is on can be suppressed to the sum of the load current IL and the constant current Io.

While a combination of the AC power source AC-SUP, externally-excited converter SS, and DC reactor Lo is used for the DC constant-current source CSUP, a current-type PWM converter may be used instead of the externally-excited converter SS. In order to regenerate power to the DC power source, by making up the DC constant-current source CSUP of a DC power source, a chopper circuit, and a DC reactor Lo in a similar manner, the energy in the snubber capacitor Cs can be recovered at a constant current.

While the DC smoothing capacitor Cdc, PWM converter CONV and AC power source AC-SUP are used for the DC constant-voltage source VSUP, a DC smoothing capacitor Cdc, a DC/DC converter, and a DC power source may be used instead. Additionally, a DC smoothing capacitor Cdc, a step-up chopper, and a DC power source may be used as well.

Figure 16:
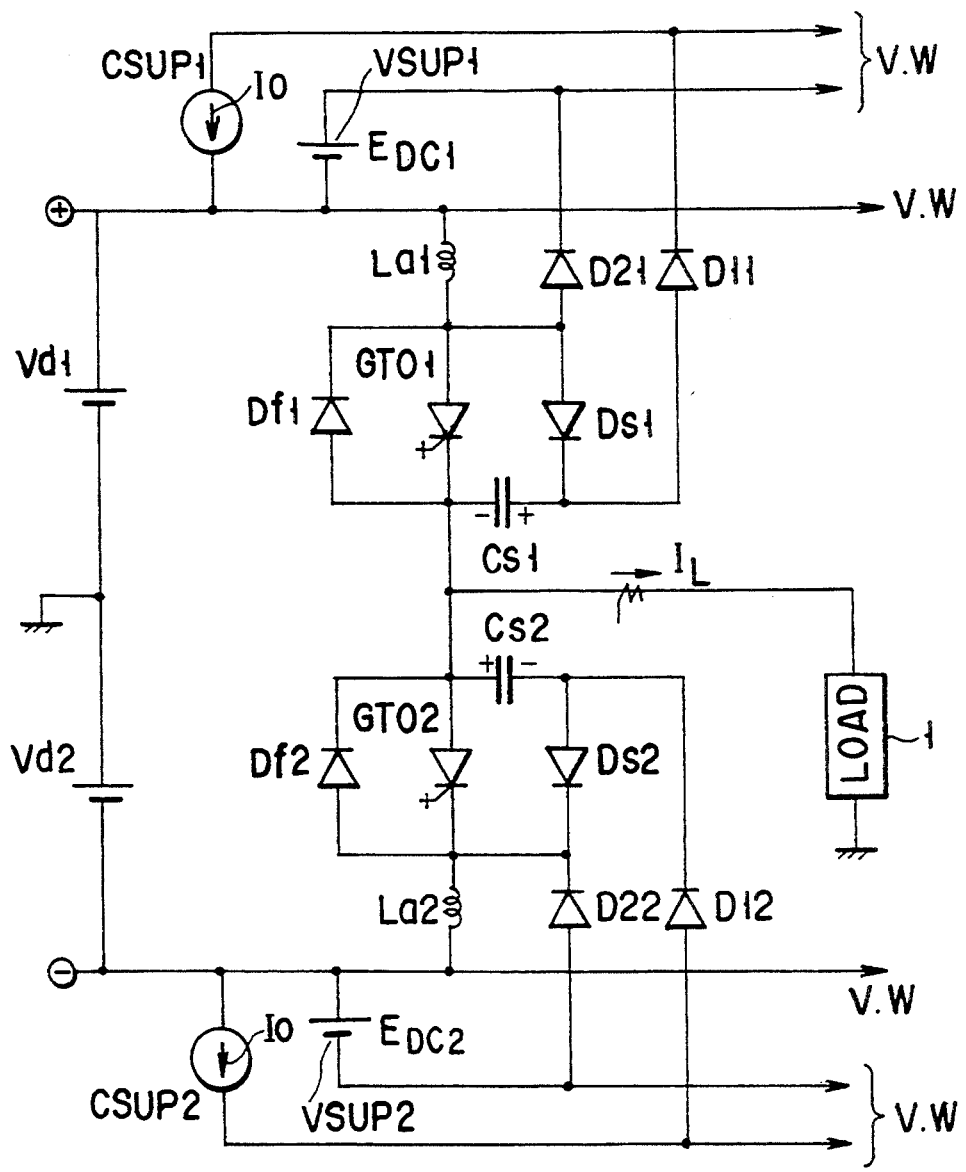
FIG. 16 is a schematic diagram of another embodiment in which a snubber energy recovery circuit associated with the present invention is applied to a voltage-type converter.

FIG. 16 is a schematic diagram of another embodiment of a snubber energy recovery circuit of the present invention. In this embodiment, a snubber energy recovery circuit of the present invention is applied to a voltage-type inverter that converts DC current into AC power of a variable voltage and a variable frequency. The construction of only one phase (U phase) is shown. The construction of a voltage-type inverter and its operating waveform diagrams have been already explained in FIG. 10, and FIG. 11, respectively.

In an inverter circuit constructed as shown in this embodiment, the upper self turn-off switching device GTO1 is provided with a snubber energy recovery circuit connected to the positive-side line (+) of the DC power source Vd, and the lower self turn-off switching device GTO2 is provided with a snubber energy recovery circuit connected to the negative-side line of the DC power source Vd. The construction of each snubber energy recovery circuit is the same as that shown in FIG. 14, and operates in the same manner.

Specifically, when GTO1 turns off, most of the energy in the anode reactor La is recovered to the DC constant-voltage source VSUP1. When the GTO turns on, the energy in the snubber capacitor Cs is recovered to the constant-current source CSUP1. The snubber recovery circuits for the upper self turn-off switching devices of V phase and w phase can share the upper DC constant-current source CSUP1 via the respective first recovery diodes, and the upper DC constant-voltage source VSUP1 via the respective second recovery diodes.

Since in the lower snubber recovery circuits, the applied voltage to the snubber capacitor Cs2 has a polarity shown, the first and second recovery diodes D12 and D22, and the DC constant-current source CSUP2 and DC constant-voltage source VSUP follow the direction shown. The remaining components operate similarly to the upper snubber recovery circuit. The snubber recovery circuits for the lower self turn-off switching devices of V phase and W phase can share the lower DC constant-current source CSUP2 via the respective first recovery diodes, and the lower DC constant-voltage source VSUP2 via the respective second recovery diodes.

Figure 17:
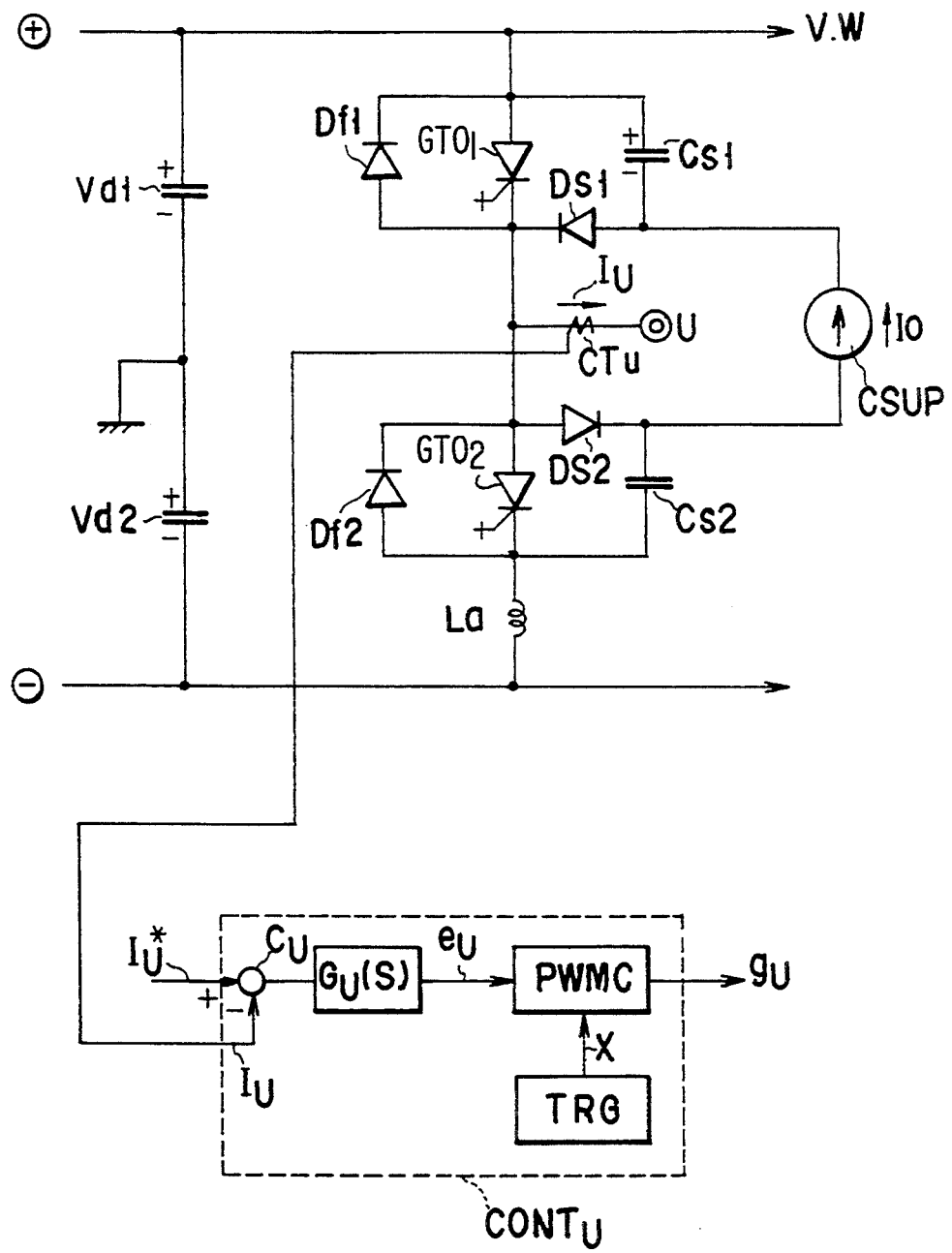
FIG. 17 is a schematic diagram of an embodiment in which a snubber energy recovery circuit associated with the present invention is applied to a two-level output inverter.

FIG. 17 shows an example of applying a snubber energy recovery circuit associated with the third embodiment of the present invention to a voltage-type self-excited converter. The voltage-type self-commutated converter shown in the figure is a two-level output inverter, with only one phase (U phase) being shown and the other V and w phases being omitted.

In the two-level output inverter shown in the figure, a series circuit containing a first switching device GTO1 and a second switching device GTO2, both in a forward direction, and a reactor La, is connected between the positive and negative terminals of a power source composed of two DC power sources Vd1 and Vd2. The junction point between the first and second switching devices S1 and S2 is connected to one end of the U-phase load, the other end of which is maintained at a potential equal to the voltage at the junction point between the DC power supplies Vd1 and Vd2.

The switching devices S1 and S2 are connected in parallel-opposition with freewheeling diodes Df1 and Df2, and in parallel with snubber circuits. The snubber circuit provided for the first switching device S1 is made up of a snubber diode Ds1 and a snubber capacitor Cs1. The snubber circuit provided for the second switching device GTO2 is made up of a snubber diode Ds2 and a snubber capacitor Cs2.

A DC constant-current source CSUP is provided between the junction point of the snubber diode Ds1 and the snubber capacitor Cs1 and the junction point of the snubber diode Ds2 and the snubber capacitor Cs2.

Reference characters CTU indicate a load-current detector and CONTU a load-current control circuit.

First, the control operation of the load current IU will be explained briefly.

The load-current control circuit CONTU is composed of a comparator CU, a current-control compensation circuit GU(S), a pulse-width modulation control circuit PWMC, and a triangular wave generator TRG.

The current detector CTU senses the load current IU, and the comparator CU obtains a deviation $\epsilon U$ from the designated current value IU*: $\epsilon U = IU^* - IU$. The deviation $\epsilon U$ is amplified by the current-control compensation circuit GU(s), and the resulting signal is supplied to the pulse-width modulation (PWM) control circuit PWMC.

Figure 18:
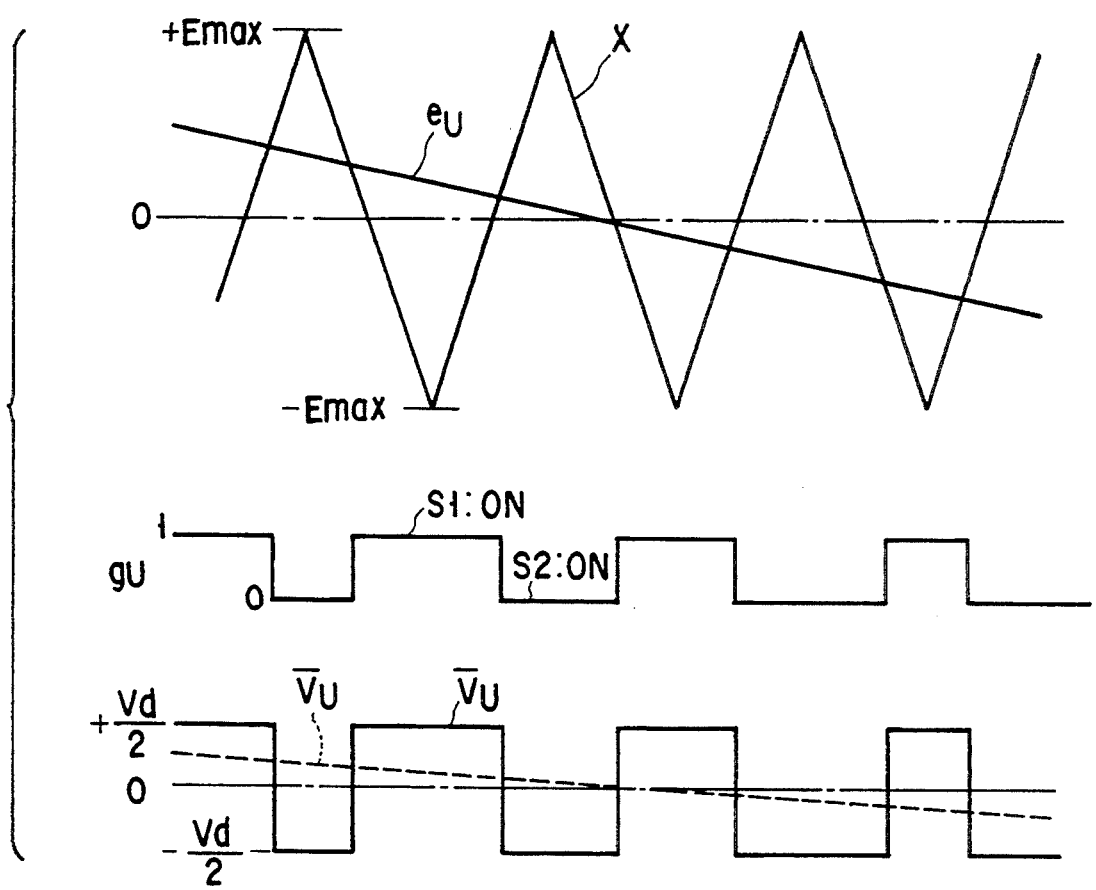
FIG. 18 is a set of operating waveform diagrams for the snubber energy recovery circuit of FIG. 17.

FIG. 18 shows a time chart for explaining the PWM control operation. In the figure, reference character X indicates a carrier (triangular wave) signal for PWM control, eU an input signal (voltage reference signal) from the control circuit GU(S), gU a gate signal to elements GTO1 and GTO2, and VU the output voltage of the inverter.

For a carrier X, a triangular wave varying between −Emax and +Emax is prepared. The wave is compared with the input signal eU to produce a gate signal gU to the elements GTO1 and GTO2. The elements operate as follows:

When eU>X, GTO1 is on (GTO2 is off) for gU=1
When eU<X, GTO1 is off (GTO2 is on) for gU=0

If the DC power source voltage Vd1=Vd2=Vd/2, the output voltage VU of the U-phase inverter will be:

VU=+Vd2, when GTO1 is on
VU=−Vd2, when GTO2 is on

The average of VU is a value proportional to the input signal eU.

When IU*>IU is reached, the deviation εU becomes positive, which increases the input signal eU for PWM control, making the on period of the element S1 longer. As a result, the output voltage VU rises, which increases the load current IU so that IU*=IU may be reached.

Similarly, when IU*>IU is reached, the deviation εU becomes negative, which reduces the input signal eU for PWM control, making the on period of the element GTO1 shorter. As a result, the output voltage VU decreases, which reduces the load current IU so that IU*=IU may be reached.

Although surge voltages are caused by the inductance of the wires and the anode reactor La when the elements GTO1 and GTO2 are turned off, those surge voltages are absorbed by the snubber capacitors Cs1 and Cs2.

Next, the operation of the snubber energy recovery circuit will be explained.

The current-suppression reactor La serves to suppress the rising rate (di/dt) of current when the element GTO1 or GTO2 turns on. Since there is the danger that the element is damaged when the current increasing rate is large, the maximum value of di/dt is usually determined for each element. The value of La is determined by the DC source voltage Vd and the maximum of di/dt. The snubber capacitors Cs1 and Cs2 serve to suppress the rising rate (dv/dt) of a voltage applied to the element when the element GTO1 or GTO2 turns off. When the voltage rising rate (dv/dt) becomes large, the turned-off switching devices are fired again, which turns on the elements GTO1 and GTO2 simultaneously, causing a DC short circuit, with the result that the elements are destroyed by an excessive current. The values of the snubber capacitors Cs1 and Cs2 are determined by the maximum value of the element's breaking current and dv/dt.

When the element GTO1 turns off while the load current IU is flowing in the direction shown, the current IU comes to flow through the diode Df2. At the time, voltages are caused by the wiring inductance and the anode reactor La, and the energy of the voltages is transferred to the snubber capacitor Cs1 via the snubber diode. That is, the snubber capacitor Cs1 is applied with the voltage Vc1 caused by the anode reactor La and others in addition to the DC source voltage Yd.

The current Io from the DC constant-current source CSUP normally flows in a path running through the DC constant-current source CSUP, snubber diode Ds1, snubber diode Ds2, and DC constant-current source CSUP in that order.

When the element GTO1 turns on, the current Io from the DC constant-current source CSUP flows in a path running through the DC constant-current source CSUP, snubber capacitor Cs1, element GTO1, snubber diode Ds2, and DC constant-current source CSUP in that order. That is, the voltage Vc1 at the snubber capacitor Cs1 discharges at a constant current Io. The DC current Io is selected for a value nearly one digit lower than the rated output current (load current) in the main circuit.

When the element GTO1 is turned on, the element GTO1 carries a current equal to the sum of the load current IU and the constant current Io. Since the DC constant current Io is one digit smaller than the load current IU, an increase in current in the element becomes less significant.

If the current Io is constant, the time ΔTo for the voltage Vc1 of the snubber capacitor Cs1 to become zero is expressed as:

$$\Delta To = Vc1 \cdot Cs1 / Io$$

If Vc1=2,000 V, Cs=6 μF, and Io=200 A, this gives ΔTo=60 μsec.

When the capacitor voltage Vc1=0 is reached, the snubber diode Ds1 conducts current again, which permits the current Io from the DC constant-current source CSUP to flow in a path running through CSUP, Ds1, Ds2, and CSUP in that order. After this, the element GTO1 is always ready to be turned off. The element GTO1 only requires the minimum on time of ΔTo=60 μsec.

When the element GTO2 is turned on and off, the snubber capacitor Cs2 is charged and discharged in a similar manner.

Figure 19:
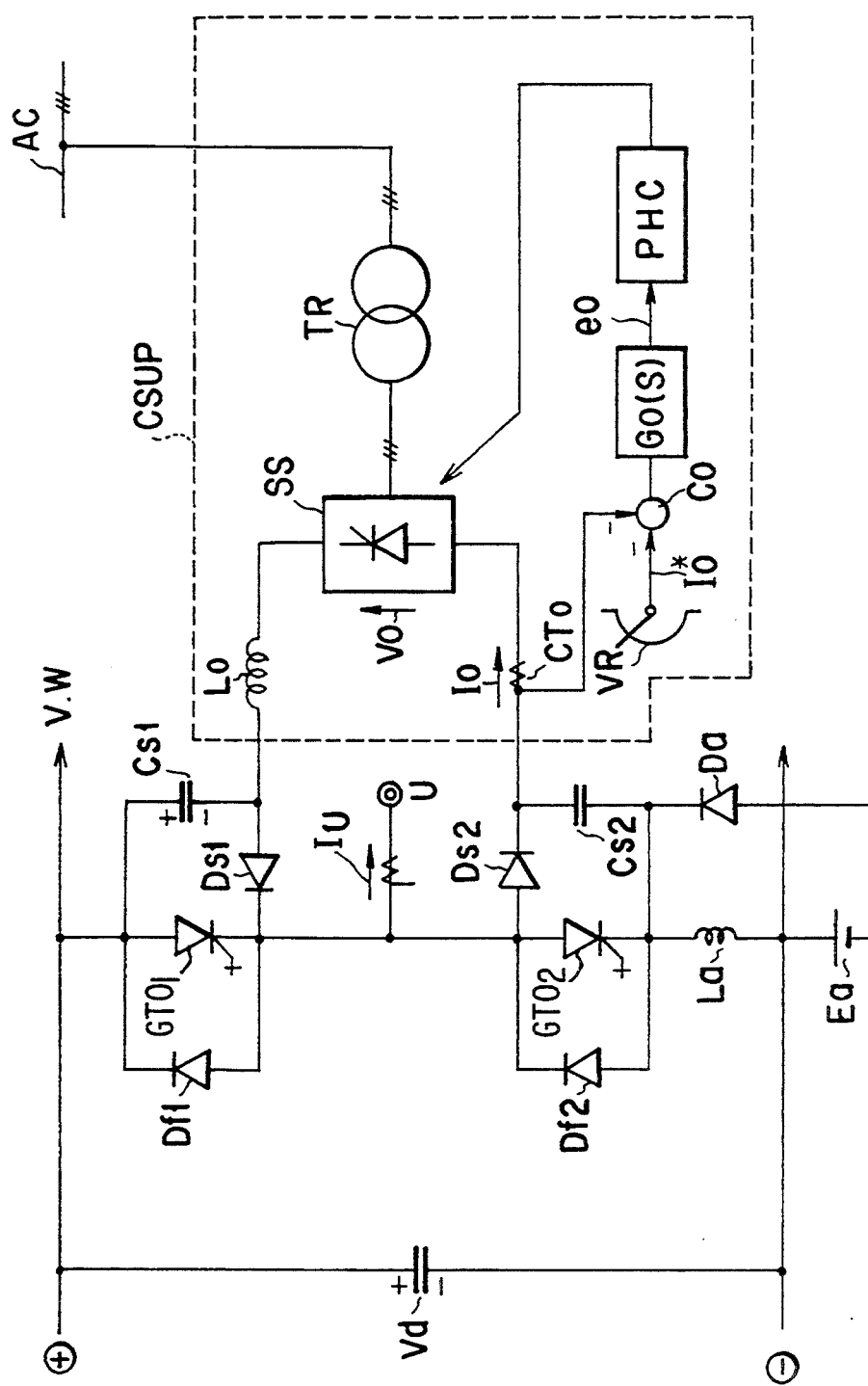
FIG. 19 is a diagram showing a concrete construction of a DC constant-current source provided for the snubber energy recovery circuit of FIG. 17.

FIG. 19 shows the construction of a concrete embodiment of the DC constant-current source CSUP.

The DC constant-current source CSUP is composed of an AC power source AC, a transformer TR, an externally-excited converter SS, a DC reactor Lo, a current detector CTo, a current setting unit VR, a comparator Co, a DC current control compensation circuit Go(S) and a phase control circuit PHC.

The operation of the DC constant-current source CSUP will be explained.

The externally-excited converter SS, which is a power converter that converts three-phase alternating current into direct current, can change the output voltage Vo from a positive to a negative value by, for example, connecting six thyristors so as to form a bridge circuit, and controlling the firing phase angle of each element. The thyristors undergo natural commutation, making use of AC source voltage.

First, the current detector CTo senses the DC current Io, and supplies it to the comparator Co. The comparator Co compares the sensed current value Io with the current setting value Io* from the current setting unit VR to obtain a deviation of εo=Io*−Io. The deviation so is amplified by the control compensation circuit Go(S), and the resulting signal is supplied as a voltage designation eo to the phase control circuit PHC. The phase control circuit PHC controls the firing phase angle α of the externally-excited converter SS in such a manner that the phase a of the AC current Is always lags behind that of the voltage Vs of the AC power source AC in order to cause the thyristor to commutate current naturally. Normally, cosine wave control is done to provide a firing phase angle of $\alpha = \cos^{-1} eo$ according to the voltage designation eo. The output voltage Vo of the externally-excited converter SS is determined by the effective value Vs of the AC voltage and the firing phase angle α, and expressed as:

$$V_o = k \cdot V_s \cdot \cos \alpha$$

Namely, Vo has a value proportional to the designated voltage value eo. When eo is positive, the phase angle a will be $0° < \alpha < 90°$, and the output Vo also be positive. When eo is negative, the phase angle $\alpha$ will be $90° < \alpha < 180°$, and the output voltage Vo be negative.

When Vo is negative, the power is regenerated to the AC power source AC. When Io* > Io, the deviation $\epsilon$o is positive, increasing the designated voltage value eo. As a result, the output voltage Vo of the externally-excited converter SS is allowed to increase in the direction of arrow in the figure, thereby increasing the DC current Io. Conversely, when Io* < Io, the deviation so becomes negative, decreasing the designated voltage value eo (making the value negative). As a result, the output voltage Vo of the externally-excited converter SS follows the opposite direction to the arrow in the figure, decreasing the DC current Io. In this way, the DC current Io is controlled so as to coincide with the designated value Io*. By maintaining the designated current value Io* at a constant value, the DC current Io is always kept constant.

The DC current Io is normally flowing in a path running through SS, Lo, Ds1, Ds2, and SS in that order. When the element GTO1 turns on, the snubber diode Ds1 is reverse-biased with the voltage of the snubber capacitor Cs1, which allows the DC current Io to flow in a path running through SS, Lo, Cs1, GTO1, Ds2, and SS in that order.

At this time, although the voltage of the snubber capacitor Cs1 serves to increase the DC current Io, the DC current control circuit makes the voltage Vo of the externally-excited converter SS negative, allowing the power to be recovered to the AC power source AC. That is, the energy in Cs1 can be regenerated to the AC power source AC via the constant-current source CSUO.

Similarly, when the element GTO2 turns on, the snubber diode Ds2 is reverse-biased with the voltage of the snubber capacitor Cs2, which allows the DC current Io to flow in a path running through SS, Lo, Ds1, GTO2, Cs2, and SS in that order. At this time, although the voltage of the snubber capacitor Cs2 serves to increase the DC current Io, the DC current control circuit makes the voltage Vo of the externally-excited converter negative, allowing the power to be recovered to the AC power source AC. That is, the energy in the snubber capacitor Cs2 can also be recovered to the AC power source AC via the constant-current source CSUP.

In FIG. 19, the diode Da and constant-voltage source Ea are provided to clamp surge voltages caused by the anode reactor La. Specifically, when the element S1 turns off while the load current IU is flowing in the direction of arrow in the figure, the load current IU begins to flow via the anode reactor La and freewheeling diode Df2. At this time, a surge voltage develops in the anode reactor La, introducing the danger of exceeding the withstand voltages of the snubber capacitor Cs1, element GTO1, and others.

when the surge voltage becomes higher than the constant-voltage source Ea, the diode Da conducts current, which recover the energy in La to the constant-voltage source Ea to prevent the surge voltage from being larger than Ea. The voltage Ea is selected for a value nearly one digit smaller than the voltage of the main DC power source Vd.

FIG. 20 shows an embodiment in which a snubber energy recovery circuit of the present invention is applied to a three-level output inverter. In the three-level output inverter in the figure, the positive and negative sides of a DC power source are provided with constant-voltage sources Ea1 and Ea2, respectively. A series circuit that contains a first reactor La1, first through fourth switching devices GTO1 through GTO4, and second reactor La2 connected in that order, is connected across the DC power source from its positive to negative sides. Freewheeling diodes Df1 through Df4 are connected inversely in parallel with the first through fourth switching devices GTO1 through GTO4. Clamping diodes Dc1 and Dc2 are inserted between the mid-junction point of two DC power source Vd1 and Vd2 and the junction of the first and second switching devices and between the mid-junction point and the junction of the third and fourth switching devices, respectively.

In the snubber energy recovery circuit, snubber circuits are connected in parallel with first through fourth switching devices GTO1 through GTO4, respectively. In a snubber circuit for the first switching device GTO1, the cathode of a snubber diode Ds1 is connected to the cathode of the element GTO1, and between their anodes, a snubber capacitor Cs1 is connected. A snubber circuit for the second switching device GTO2 is connected in the same way.

In a snubber circuit for the third switching device GTO3, the anode of a snubber diode Ds3 is connected to the anode of the element GTO3, and between their cathodes, a snubber capacitor Cs3 is connected. A snubber circuit for the fourth switching device GTO4 is connected in the same way.

A DC constant-current source CSUP is connected between the junction point of the snubber diode Ds2 and snubber capacitor Cs2 and the junction point of the snubber diode Ds3 and snubber capacitor Cs3.

A recovery diode DR1 is provided between the junction point of the snubber diode Ds1 and snubber capacitor Cs1 and the junction point of the snubber diode Ds2 and snubber capacitor Cs2. Similarly, a recovery diode DR2 is provided between the snubber circuits for the elements GTO3 and GTO4. Clamping diodes Da1 and Da2 to clamp reactor voltages are inserted between the snubber capacitor Cs1 and constant-voltage source Ea1 and between the snubber capacitor GTO4 and constant-voltage source Ea2.

In the three-level output inverter, elements S1 through GTO4 turn on in units of two. Specifically, if the DC voltage Vd1 = Vd2 = Vd/2, the inverter output voltage VU will be:

VU = +Vd/2 when GTO1 and GTO2 are on
VU = 0 when GTO2 and GTO3 are on
VU = −Vd/2 when GTO3 and GTO4 are on Since three of the elements are turned on simultaneously, this short-circuits the power source, destroying the elements. To avoid this, the gate signals are supplied so that the elements GTO1 and GTO3 may operate in opposite directions and the element S2 and S4 operate in opposite directions.

When the elements GTO2 and GTO3 turn on, the voltage VU at the U-phase output terminal is clamped to the mid-point of the DC power source via the clamping diodes Dc1 and Dc2. For this reason, the three-level output inverter is also called the neutral point clamped inverter.

The anode reactors La1 and La2 serve to suppress the current changing rate (di/dt) when any of the elements GTO1 through GTO4 turns on. As explained earlier, the diodes Da1 and Da2, constant-voltage sources Ea1, and Ea2, and anode reactors La1 and La2 serve to suppress surge voltages in the anode reactors La1 and La2.

Hereinafter, the snubber recovery operation of the embodiment in FIG. 20 will be explained.

For example, when the elements GTO2 and GTO3 are on (the elements S1 and GTO4 are off), the snubber capacitors Cs1 and Cs4 are applied with a voltage of approximately Vd/2 of the polarity shown. At this time, the current Io from the DC constant-current source CSUP is flowing in a path running through CSUP, Ds2, Ds3, and CSUP in that order.

Next, when the element GTO3 turns off, and the element S1 turns on, the diodes Ds1 and Ds2 are reverse-biased with the voltage of the snubber capacitor Cs1, which allows the current Io to flow in a path running through CSUP, DR1, Cs1, GTO1, GTO2, Ds3, and CSUP in that order, discharging the voltage of the capacitor Cs1. If the current Io is constant, the time $\Delta$To for the voltage Vc1 of the capacitor Cs1 to become zero will be expressed as;

$$\Delta To = Vc1 \cdot Cs1 / Io$$

If Cs1=2,000 V, Cs=6 μF, and Io=200 A, this gives $\Delta$To=60 μsec.

When the capacitor voltage Vc1=0 is reached, the snubber diode Ds2 conducts current again, which permits the current Io from the constant-current source CSUP to flow in a path running through CSUP, Ds2, Ds3, and CSUP in that order. After this, the element GTO1 is always ready to be turned off.

GTO1 only requires the minimum on time of $\Delta$To=60 μsec.

When the elements GTO1 and GTO2 are on, the elements GTO3 and S4 are off, allowing a voltage to be applied to the snubber capacitors Cs3 and Cs4. In this state, when the element GTO1 turns off again, and the element GTO3 turns on, the diode Ds3 is reverse-biased with the voltage Vc3 of the capacitor Cs3, which permits the DC current Io to flow in a path running through CSUP, Ds2, GTO3, Cs3, and CSUP in that order.

Therefore, the voltage Vc3 at the capacitor Cs3 is discharged at the constant current Io, and the energy is recovered to the constant-current source CSUP. When the capacitor voltage Vc3=0 is reached, the snubber diode Ds3 conducts current again, which allows the current Io from the constant-current source CSUP to flow in a path running through CSUP, Ds2, Ds3, and CSUP in that order. After this, the element GTO3 is always ready to be turned off.

In the state where the elements GTO2 and GTO3 are on, the element GTO2 turns off and the element GTO4 turns on, the diodes Ds3 and Ds4 are reverse-biased with the voltage at the capacitor GTO4, which permits the current Io to flow in a path running through CSUP, Ds2, GTO3, GTO4, Cs4, DR2, and CSUP in that order, thereby discharging the voltage of the capacitor Cs4.

The energy in the capacitor Cs4 is recovered to the constant-current source CSUP. When the capacitor voltage Vc4=0 is reached, the snubber diode Ds3 conducts current again, which allows the current Io from the constant-current source CSUP to flow in a path running through CSUP, Ds2, Ds3, and CSUP in that order. At this time, the element GTO4 is always ready to be turned off.

In the state where the elements GTO3 and GTO4 are on, the element GTO4 turns off again and the element GTO2 turns on, the diode Ds2 is reverse-biased with the voltage Vc2 of the capacitor Cs2, which permits the DC current Io to flow in a path running through CSUP, Cs2, GTO2, Ds3, and CSUP in that order.

Therefore, the voltage Vc2 at the capacitor Cs2 discharges at the constant current Io, and its energy is recovered to the constant-current source CSUP. When the capacitor voltage Vc2=0 is reached, the snubber diode Ds2 conducts current again, which allows the current Io from the constant-current source CSUP to flow in a path running through CSUP, Ds2, Ds3, and CSUP in that order. After this, the element GTO2 is always ready to be turned off.

Although the three-level output inverter produces output voltages of (+), (0), and (−), it changes directly from the (+) mode to the (−) mode less frequently. It changes its output voltages only after passing through the (0) output mode once:

When the (+) mode is changed to the (0) mode, the snubber capacitor Cs3 discharges When the (0) mode is changed to the (−) mode, the snubber capacitor Cs4 discharges When the (−) mode is changed to the (0) mode, the snubber capacitor Cs2 discharges When the (0) mode is changed to the (+) mode, the snubber capacitor Cs3 discharges Since the four snubber capacitors Cs1 through Cs4 discharge one by one as described above, the value of the current Io from the constant-current source CSUP to be prepared only requires to be determined after taking into account the discharging time of a single capacitor.

Figure 21:
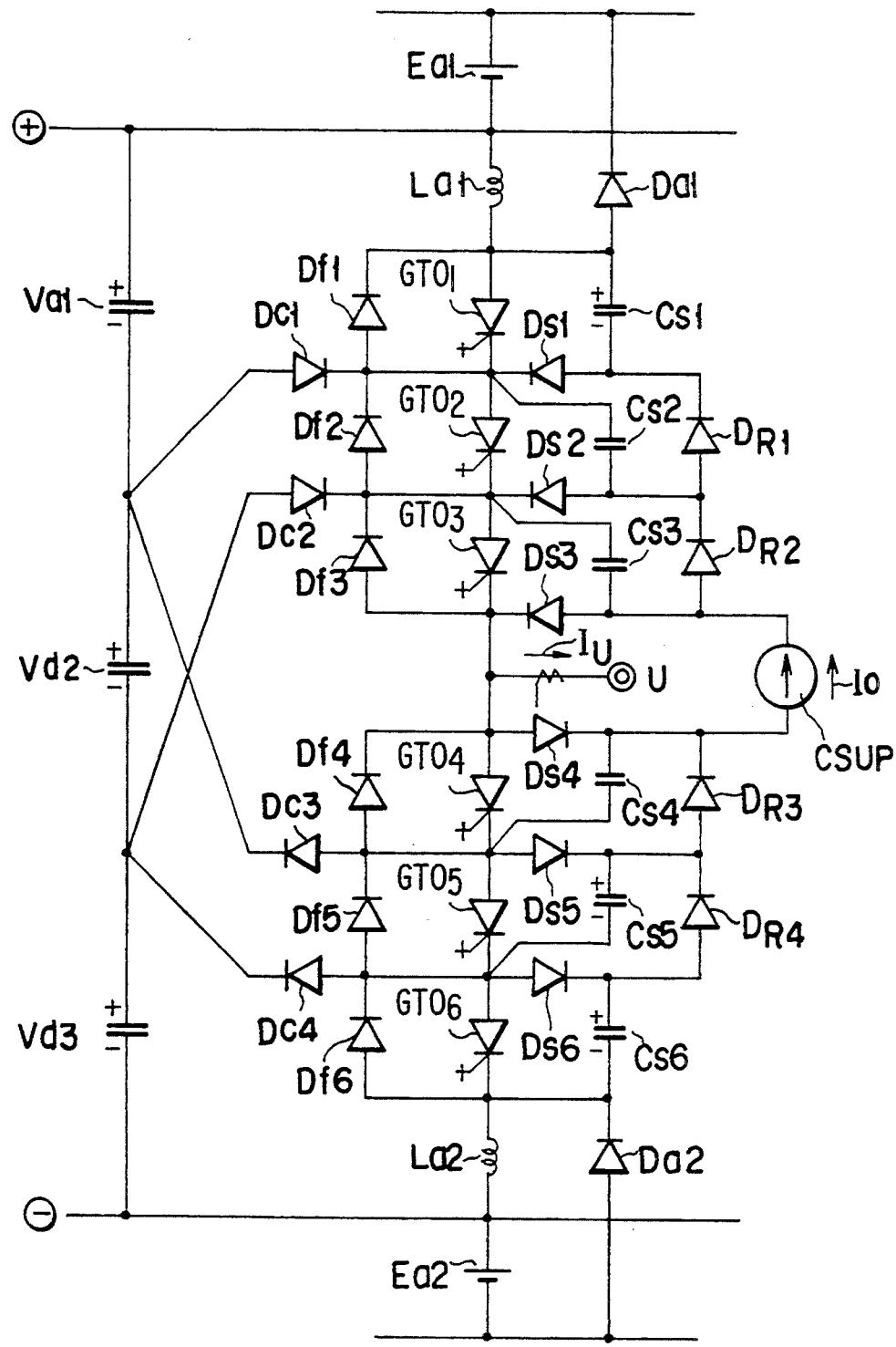
FIG. 21 is a schematic diagram of an embodiment in which a snubber energy recovery circuit associated with the present invention is applied to a four-level output inverter.

The embodiment shown in FIG. 21 is an example of applying a snubber energy recovery circuit of the present invention to a four-level output inverter.

In the figure, reference characters Vd1 through Vd3 indicate DC voltage sources, La1 and La2 current-suppressing anode reactors, GTO1 through GTO6 elements, Df1 through Df6 freewheeling diodes, Dc1 through Dc4 clamping diodes, Cs1 through Cs6 snubber capacitors, Ds1 through Ds6 snubber diodes, Ea1 and Ea2 constant-voltage sources, Da1 and Da2 anode reactor voltage-clamping diodes, DR1 through DR4 recovery diodes, and CSUP a DC constant-current source.

In the four-level output inverter, the elements S1 through S6 turn on in units of three. Specifically, if it is assumed that the DC voltage is Vd1=Vd2=Vd3=Vd/3, and Vd/2 is an imaginary mid-point (zero voltage), the inverter output voltage VU will be:

VU = +Vd/2 when GTO1, GTO2, and GTO3 are on

VU = +Vd/6 when GTO2, GTO3, and GTO4 are on

VU = −Vd/6 when GTO3, GTO4, and GTO5 are on

VU = −Vd/2 when GTO4, GTO5, and GTO6 are on

Since four or more of the elements are turned on simultaneously, this short-circuits the power source, destroying the elements. To avoid this, the gate signals are supplied so that the elements GTO1 and GTO4 may operate in opposite directions and the element GTO2 and GTO5 operate in opposite directions.

When the elements GTO2, GTO3, and GTO4 turn on, the voltage VU at the output terminal U is clamped to the voltage at the junction point of the DC power sources Vd1 and Vd2 via the clamping diodes Dc1 and Dc3, independently of the direction of the load current IU. When the elements GTO3, GTO4, and GTO4 turn on, the voltage VU at the output terminal U is clamped to the voltage at the junction point of the DC power sources Vd2 and Vd3 via the clamping diodes Dc2 and Dc4, independently of the direction of the load current IU.

The anode reactors La1 and La2 serve to suppress the current changing rate (di/dt) when any of the elements GTO1 through GTO6 turns on.

As explained earlier, the diodes Da1 and Da2, and constant-voltage sources Ea1 and Ea2 serve to suppress surge voltages in the anode reactors La1 and La2.

Hereinafter, the snubber recovery operation of the present embodiment will be explained.

For example, when the elements GTO2, GTO3, and GTO4 are on (the elements GTO1, GTO5, and GTO6 are off), the snubber capacitors Cs1, Cs5, and Cs6 are applied with a voltage of approximately Vd/3 of the polarity shown. At this time, the current Io from the DC constant-current source CSUP is flowing in a path running through CSUP, Ds3, Ds4, and CSUP in that order.

Next, when the element GTO4 turns off, and the element GTO1 turns on, the diodes Ds1, Ds2, and Ds3 are reverse-biased with the voltage of the snubber capacitor Cs1, which allows the current Io to flow in a path running through CSUP, DR2, DR1, Cs1, GTO1, GTO2, GTO3, Ds4, and CSUP in that order, discharging the voltage of the capacitor Cs1. If the current Io is constant, the time ΔTo for the voltage Vc1 of the capacitor Cs1 to become zero will be expressed as;

$$\Delta To = Vc1 \cdot Cs1 / Io$$

If Cc1=2,000 V, Cs=6 μF, and Io=200 A, this gives ΔTo=60 μsec.

When the capacitor voltage Vc1=0 is reached, the snubber diode Ds3 conducts current again, which permits the current Io from the constant-current source CSUP to flow in a path running through CSUP, Ds3, Ds4, and CSUP in that order. After this, the element GTO1 is always ready to be turned off. GTO1 only requires the minimum on time of ΔTo=60 μsec.

When the elements GTO1, GTO2, and GTO3 are on, the elements GTO4, GTO5, and GTO6 are off, allowing a voltage to be applied to the snubber capacitors Cs4 through Cs6. In this state, when the element GTO1 turns off again, and the element GTO4 turns on, the diode Ds4 is reverse-biased with the voltage Vc4 of the capacitor Cs4, which permits the DC current Io to flow in a path running through CSUP, Ds3, GTO4, Cs4, and CSUP in that order. Therefore, the voltage Vc4 at the capacitor Cs4 is discharged at the constant current Io, and the energy is recovered to the constant-current source CSUP. When the capacitor voltage Vc4=0 is reached, the snubber diode Ds4 conducts current again, which allows the current Io from the constant-current source CSUP to flow in a path running through CSUP, Ds3, Ds4, and CSUP in that order. After this, the element GTO4 is always ready to be turned off.

The discharging of the other snubber capacitors Cs2, Cs3, Cs5, and Cs6 is done similarly, and their energy is recovered to the constant-current source CSUP.

As described earlier, the four-level output inverter produces output voltages of (+Vd/2), (+Vd/6), (−Vd/6), and (−Vd/2). each mode being controlled so as to change to another mode by way of a particular stage.

Specifically, when the (+Vd/2) mode is changed to the (+Vd/6) mode, the snubber capacitor Cs4 discharges; when the (+Vd/6) mode is changed to the (−Vd/6) mode, the snubber capacitor Cs5 discharges; when the (−Vd/6) mode is changed to the (−Vd/2) mode, the snubber capacitor Cs6 discharges; when the (−Vd/2) mode is changed to the (−Vd/6) mode, the snubber capacitor Cs3 discharges; when the (−Vd/6) mode is changed to the (+Vd/6) mode, the snubber capacitor Cs2 discharges; and when the (+Vd/6) mode is changed to the (+Vd/2) mode, the snubber capacitor Cs1 discharges.

Since the six snubber capacitors Cs1 through Cs6 discharge one by one as described above, the value of the current Io from the constant-current source CSUP to be prepared only requires to be determined after taking into account the discharging time of a single capacitor.

Figure 22:
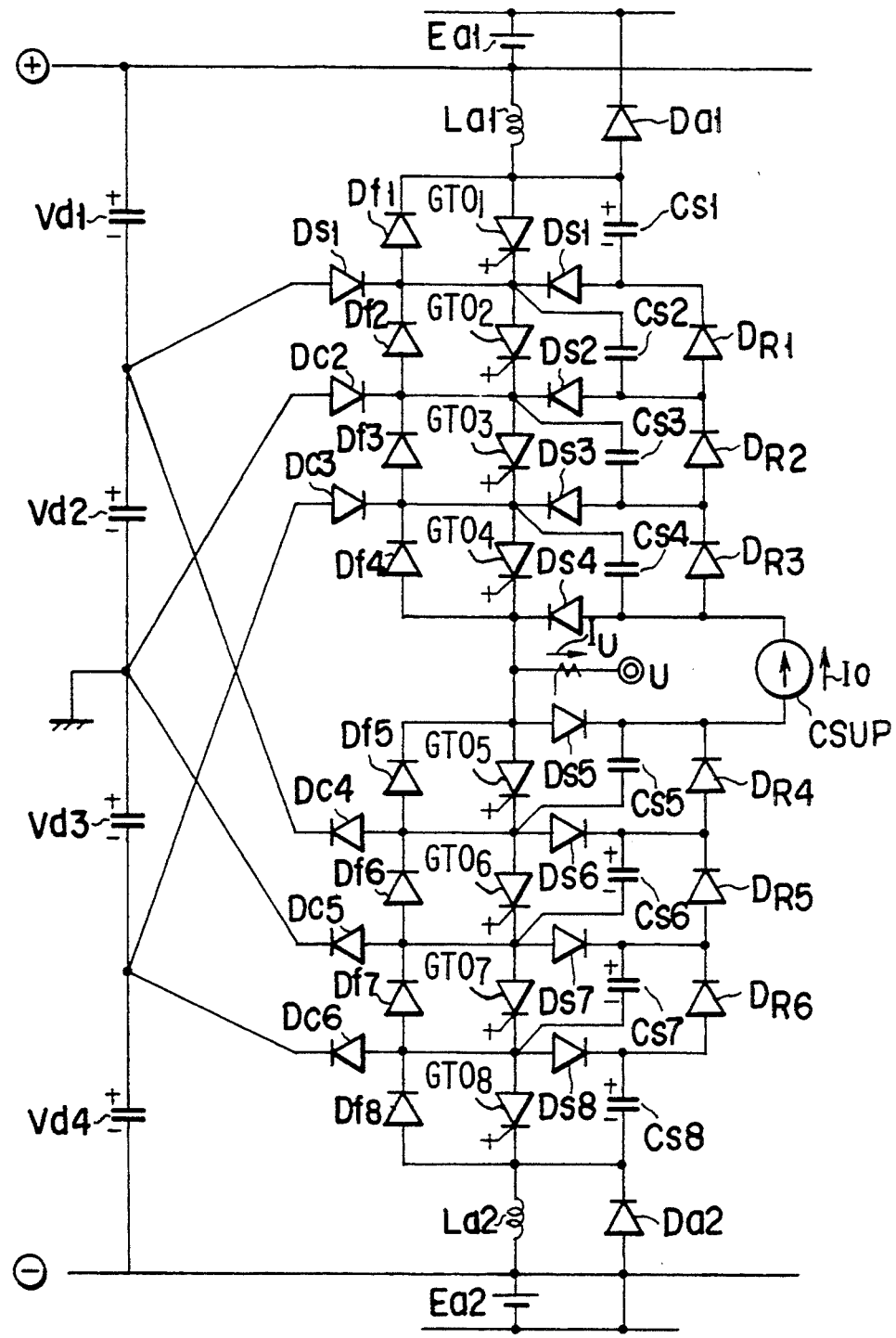
FIG. 22 is a schematic diagram of an embodiment in which a snubber energy recovery circuit associated with the present invention is applied to a five-level output inverter.
Figure 23:
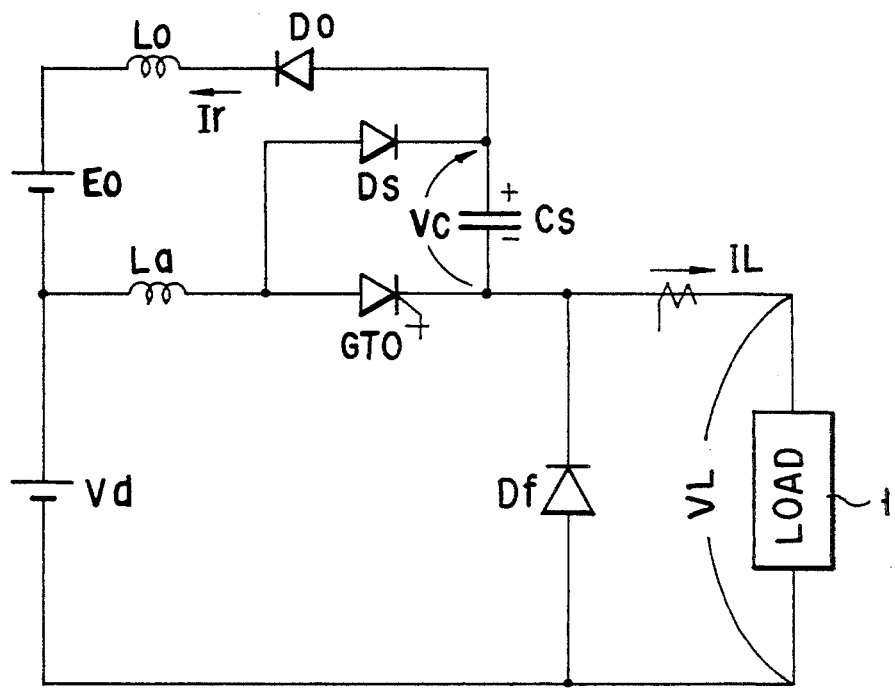
FIG. 23 is a schematic diagram of a conventional snubber energy recovery circuit.

The embodiment shown in FIG. 22 is an example of applying a snubber energy recovery circuit of the present invention to a five-level output inverter. In the figure, reference characters Vd1 through Vd4 indicate DC voltage sources, La1 and La2 current-suppressing anode reactors, GTO1 through GTO8 elements, Df1 through Df8 freewheeling diodes, Dc1 through Dc6 clamping diodes, Cs1 through Cs8 snubber capacitors, Ds1 through Ds8 snubber diodes, Ea1 and Ea2 constant-voltage sources, Da1 and Da2 anode reactor voltage-clamping diodes, DR1 through DR6 recovery diodes, and CSUP a DC constant-current source.

In the five-level output inverter, the elements GTO1 through GTO8 turn on in units of four. Specifically, if it is assumed that the DC voltage is Vd1=Vd2=Vd3=Vd4=Vd/4, and Vd/2 is an imaginary mid-point (zero voltage), the inverter output voltage VU will be:

VU=+Vd/2 when GTO1, GTO2, GTO3 and GTO4 are on

VU=+Vd/4 when GTO2, GTO3, GTO4, and GTO5 are on

Vu=0 when GTO3, GTO4, GTO5, and GTO5 are on

VU=−Vd/4 when GTO4, GTO5, GTO6 and GTO7 are on

VU=−Vd/2 when GTO5, GTO6, GTO7, and GTO8 are on

If five or more of the elements are turned on simultaneously, this short-circuits the power source, destroying the elements. To avoid this, the gate signals are supplied so that the elements GTO1 and GTO5 may operate in opposite directions, the element GTO2 and GTO6 operate in opposite directions, the elements GTO3 and GTO7 operate in opposite directions, and the elements GTO4 and S8 operate in opposite direction.

When the elements GTO2, GTO3, GTO4 and GTO5 turn on, the voltage VU at the output terminal U is clamped to the voltage at the junction point of the DC voltage sources Vd1 and Vd2 via the clamping diodes Dc1 and Dc4, independently of the direction of the load current IU. When the elements GTO3, GTO4, GTO5, and GTO6 turn on, the voltage VU at the output terminal U is clamped to the voltage at the junction point (mid-point) of the DC voltage sources Vd2 and Vd3 via the clamping diodes Dc2 and Dc5, independently of the direction of the load current IU.

Similarly, when the elements GTO4, GTO5, GTO6, and GTO7 turn on, the voltage VU at the output terminal U is clamped to the voltage at the junction point of the DC voltage sources Vd3 and Vd4 via the clamping diodes Dc3 and Dc6, independently of the direction of the load current IU.

The anode reactors La1 and La2 serve to suppress the current changing rate (di/dt) when any of the elements GTO1 through GTO8 turns on.

As explained earlier, the diodes Da1 and Da2, and constant-voltage sources Ea1 and Ea2 serve to suppress surge voltages in the anode reactors La1 and La2.

Hereinafter, the snubber energy-recovering operation of the present embodiment will be explained.

For example, when the elements GTO2, GTO3, GTO4, and GTO5 are on (the elements GTO1, GTO6, GTO7, and GTO8 are off), the snubber capacitors Cs1, Cs6, Cs7 and Cs8 are applied with a voltage of approximately Vd/4 of the polarity shown.

At this time, the current Io from the DC constant-current source CSUP is flowing in a path running through CSUP, Ds4, Ds5, and CSUP in that order.

Next, when the element GTO5 turns off, and the element GTO1 turns on, the diodes Ds1, Ds2, Ds3, and Ds4 are reverse-biased with the voltage of the snubber capacitor Cs1, which allows the current Io to flow in a path running through CSUP, DR3, DR2, DR1, Cs1, GTO1, GTO2, GTO3, GTO4, Ds5, and CSUP in that order, discharging the voltage of the capacitor Cs1. If the current Io is constant, the time $\Delta To$ for the voltage Vc1 of the capacitor Cs1 to become zero will be expressed as;

$$\Delta To = Vc1 \cdot Cs1 / Io$$

If Cc1=2,000 V, Cs=6 μF, and Io=200 A, this gives $\Delta To = 60$ μsec.

When the capacitor voltage Vc1=0 is reached, the snubber diode Ds4 conducts current again, which permits the current Io from the constant-current source CSUP to flow in a path running through CSUP, Ds4, Ds5, and CSUP in that order. After this, the element GTO1 is always ready to be turned off. GTO1 only requires the minimum on time of $\Delta To = 60$ μsec.

When the elements GTO1, GTO2, GTO3, and GTO4 are on, the elements GTO5, GTO6, GTO7, and GTO8 are off, allowing a voltage to be applied to the snubber capacitors Cs5 through Cs8. In this state, when the element GTO1 turns off again, and the element GTO5 turns on, the diode Ds5 is reverse-biased with the voltage Vc5 of the capacitor Cs5, which permits the constant current Io to flow in a path running through CSUP, Ds4, GTO5, Cs5, and CSUP in that order. Therefore, the voltage Vc5 at the capacitor Cs5 is discharged at the constant current Io, and the energy is regenerated to the constant-current source CSUP. When the capacitor voltage Vc5=0 is reached, the snubber diode Ds5 conducts current again, which allows the current Io from the constant-current source CSUP to flow in a path running through CSUP, Ds4, Ds5, and CSUP in that order. After this, the element GTO5 is always ready to be turned off.

The discharging of the other snubber capacitors Cs2, Cs3, Cs4, Cs6, Cs7, and Cs8 is done similarly, and their energy is regenerated to the constant-current source CSUP.

As described earlier, the five-level output inverter produces output voltages of (+Vd/2), (+Vd/4), (0), (−Vd/4), and (−Vd/2), each mode being controlled so as to change to another mode by way of a particular stage.

Specifically, when the (+Vd/2) mode is changed to the (+Vd/4) mode, the snubber capacitor Cs5 discharges; when the (+Vd/4) mode is changed to the (0) mode, the snubber capacitor Cs6 discharges; when the (0) mode is changed to the (−Vd/4) mode, the snubber capacitor Cs7 discharges; when the (−Vd/4) mode is changed to the (−Vd/2) mode, the snubber capacitor Cs8 discharges; when the (−Vd/2) mode is changed to the (−Vd/4) mode, the snubber capacitor Cs4 discharges; when the (−Vd/4) mode is changed to the (0) mode, the snubber capacitor Cs3 discharges; when the (0) mode is changed to the (+Vd/4) mode, the snubber capacitor Cs2 discharges; and when the (+Vd/4) mode is changed to the (+Vd/2) mode, the snubber capacitor Cs1 discharges.

Since the eight snubber capacitors Cs1 through Cs8 discharge one by one as described above, the value of the current Io from the constant-current source CSUP to be prepared only requires to be determined after taking into account the discharging time of a single capacitor.

Similarly, inverters with outputs of six or more levels can be constructed so that the energy in many snubber capacitors may be regenerated to the single constant-current source CSUP.

Although explanation has been made as to one phase (U phase) of the inverter, the same, of course, holds true for inverters with two phases or more. The present invention may be applied not only to inverters but also to converters that convert AC to DC. Further, while explanation has been made as to externally-excited converters, the present invention may be applied to self-commutated converters. The point is that this invention may be applied to any constant-current source that is capable of recovery.

What is claimed is:

1. A snubber energy recovery circuit for protecting at least one switching device in a main circuit from excessive current or voltage supplied to the at least one switching device, comprising:

snubber means including a series circuit connected in parallel with said at least one switching device, said series circuit including a snubber diode and a snubber capacitor connected in series;

recovering means, coupled to said snubber capacitor, including a constant-current source for recovering energy stored in the snubber capacitor and outputting said recovered energy to the main circuit via the constant-current source as a constant current, said constant-current source connected to a node of the snubber capacitor so that the snubber diode is supplied with energy output from the snubber capacitor and for supplying the constant current to the main circuit.

2. The snubber energy recovery circuit according to claim 1, wherein said constant-current source comprises:

a direct-current (DC) reactor, an alternating-current (AC) power source, an AC-to-DC power converter connected to the AC power source and connected between said DC reactor and said main circuit, and control means for controlling said AC-to-DC power converter so that a current flowing through said DC reactor remains constant.

3. The snubber energy recovery circuit according to claim 1, wherein said constant-current source comprises:

a DC reactor;

a DC voltage source;

a DC-to-DC power converter to the DC voltage source;

a double chopper circuit connected to the DC-to-DC power converter and included in the DC reactor; and control means for controlling said double chopper circuit so that a current flowing through said DC reactor remains constant.

* * * * *